(12) United States Patent
Ware et al.

(10) Patent No.: US 9,257,159 B2
(45) Date of Patent: Feb. 9, 2016

(54) LOW POWER MEMORY DEVICE

(71) Applicants: Frederick A. Ware, Los Altos Hills, CA (US); Ely K. Tsern, Los Altos, CA (US); Craig E. Hampel, Los Altos, CA (US)

(72) Inventors: Frederick A. Ware, Los Altos Hills, CA (US); Ely K. Tsern, Los Altos, CA (US); Craig E. Hampel, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/173,724

(22) Filed: Feb. 5, 2014

(65) Prior Publication Data

US 2014/0334238 A1    Nov. 13, 2014

Related U.S. Application Data

(60) Continuation of application No. 13/466,082, filed on May 7, 2012, now abandoned, which is a continuation of application No. 12/709,422, filed on Feb. 19, 2010, now Pat. No. 8,194,493, which is a continuation of application No. 12/018,489, filed on Jan. 23, 2008, now Pat. No. 7,916,570, which is a division of application No. 11/194,812, filed on Aug. 1, 2005, now Pat. No. 7,660,183.

(51) Int. Cl.
*G11C 8/00* (2006.01)
*G11C 7/10* (2006.01)
*G11C 5/14* (2006.01)
(Continued)

(52) U.S. Cl.
CPC ............ *G11C 7/1006* (2013.01); *G11C 5/14* (2013.01); *G11C 7/1039* (2013.01); *G11C 7/1051* (2013.01); *G11C 7/1096* (2013.01); *G11C 7/22* (2013.01); *G11C 7/222* (2013.01); *G11C 8/08* (2013.01); *G11C 8/12* (2013.01); *G11C 11/4063* (2013.01); *G11C 11/4076* (2013.01); *G11C 11/4085* (2013.01); *G11C 7/1045* (2013.01); *G11C 2207/2227* (2013.01)

(58) Field of Classification Search
USPC .................................................... 365/230.03
See application file for complete search history.

(56) References Cited

U.S. PATENT DOCUMENTS 5,440,514 A    8/1995    Flannagan et al.
5,680,361 A    10/1997    Ware et al.
(Continued)

FOREIGN PATENT DOCUMENTS

JP    10-172283    6/1998

OTHER PUBLICATIONS

Amendment and Response dated Oct. 12, 2010 re U.S. Appl. No. 12/018,489. 18 pages.
(Continued)

*Primary Examiner* — Anthan Tran

(57) ABSTRACT

A method of operation within a memory device is disclosed. The method comprises receiving address information and corresponding enable information in association with a memory access request. The address information includes a row address that specifies a row of storage cells within a storage array of the memory device, and the enable information includes first and second enable values that correspond respectively to first and second storage locations within the row of storage cells. The method involves selectively transferring data between the first and second storage locations and sense amplifier circuitry according to states of the first and second enable values. This includes transferring data between the first storage location and the sense amplifier circuitry if the first enable value is in an enable state and transferring data between the second storage location and the sense amplifier circuitry if the second enable value is in the enable state. The states of the first and second enable values may be separately controlled.

8 Claims, 13 Drawing Sheets

(51) Int. Cl.

| | |
|---|---|
| *G11C 7/22* | (2006.01) |
| *G11C 8/08* | (2006.01) |
| *G11C 8/12* | (2006.01) |
| *G11C 11/4076* | (2006.01) |
| *G11C 11/408* | (2006.01) |
| *G11C 11/4063* | (2006.01) |

(56) References Cited

U.S. PATENT DOCUMENTS

| | | | |
|---|---|---|---|
| 5,764,963 | A | 6/1998 | Ware et al. |
| 5,765,020 | A | 6/1998 | Barth et al. |
| 5,844,855 | A | 12/1998 | Ware et al. |
| 5,864,505 | A | 1/1999 | Higuchi |
| 5,872,996 | A | 2/1999 | Barth et al. |
| 5,875,132 | A | 2/1999 | Ozaki |
| 5,881,017 | A | 3/1999 | Matsumoto et al. |
| 5,896,545 | A | 4/1999 | Barth et al. |
| 5,940,340 | A | 8/1999 | Ware et al. |
| 6,021,482 | A * | 2/2000 | Wu et al. ............... 711/217 |
| 6,035,369 | A | 3/2000 | Ware et al. |
| 6,075,730 | A | 6/2000 | Anderson et al. |
| 6,122,189 | A | 9/2000 | Batra |
| 6,151,239 | A | 11/2000 | Batra |
| 6,163,491 | A * | 12/2000 | Iwamoto et al. ............ 365/201 |
| 6,185,149 | B1 | 2/2001 | Fujioka et al. |
| 6,209,071 | B1 | 3/2001 | Hampel et al. |
| 6,263,448 | B1 | 7/2001 | Tsern et al. |
| RE37,409 | E | 10/2001 | Richardson et al. |
| 6,314,051 | B1 | 11/2001 | Farmwald et al. |
| 6,343,352 | B1 | 1/2002 | Davis et al. |
| 6,347,354 | B1 | 2/2002 | Abhyankar et al. |
| 6,356,975 | B1 | 3/2002 | Barth et al. |
| 6,401,167 | B1 | 6/2002 | Barth et al. |
| 6,470,405 | B2 | 10/2002 | Hampel et al. |
| 6,493,789 | B2 | 12/2002 | Ware et al. |
| 6,496,897 | B2 | 12/2002 | Ware et al. |
| 6,591,353 | B1 | 7/2003 | Ware et al. |
| 6,640,292 | B1 | 10/2003 | Barth et al. |
| 6,681,268 | B1 | 1/2004 | Kikuchi et al. |
| 6,718,431 | B2 | 4/2004 | Barth et al. |
| 6,778,454 | B2 | 8/2004 | Duh et al. |
| 6,826,663 | B2 | 11/2004 | Perego et al. |
| 6,842,864 | B1 | 1/2005 | Barth et al. |
| 6,868,474 | B2 | 3/2005 | Barth et al. |
| 6,889,300 | B2 | 5/2005 | Davis et al. |
| 6,895,474 | B2 | 5/2005 | Ryan et al. |
| 2003/0131160 | A1 | 7/2003 | Hampel et al. |
| 2004/0037140 | A1 | 2/2004 | Kang |
| 2004/0047205 | A1 | 3/2004 | Hazama et al. |
| 2004/0145959 | A1 | 7/2004 | Kuge et al. |
| 2005/0152210 | A1 | 7/2005 | Park et al. |
| 2006/0069855 | A1 | 3/2006 | Ha et al. |
| 2006/0187721 | A1 | 8/2006 | Freebern |

OTHER PUBLICATIONS

Fujisawa et al., "An 8.4ns Column-Access 1.3Gb/s/pin DDR3 SDRAM with an 8:4 Multiplexed Data-Transfer Scheme," Feb. 7, 2006, IEEE International Solid-State Circuits Conference, Session 8, DRAM and TCAM, 8.4. 10 pages.

Notice of Allowance and Fee(s) Due with mail date of Jan. 6, 2011 re U.S. Appl. No. 12/018,489. 22 pages.

Office Action with mail date of Apr. 15, 2010 re U.S. Appl. No. 12/018,489 re Advisory Action Before the Filing of an Appeal Brief. 3 pages.

Office Action with mail date of Jul. 12, 2010 re U.S. Appl. No. 12/018,489. 14 pages.

Response dated Mar. 18, 2010 to the Final Office Action of Jan. 22, 2010 re U.S. Appl. No. 12/018,489. 9 pages.

Supplemental Amendment with mail date of Jun. 1, 2010 re U.S. Appl. No. 12/018,489. 11 pages.

Ware, Frederick, U.S. Appl. No. 12/018,489, filed Jan. 23, 2008, re Final Office Action mailed Jan. 22, 2010. 12 pages.

Ware, Frederick, U.S. Appl. No. 12/709,422, filed Feb. 19, 2010, re Notice of Allowance and Fee(s) Due mailed Feb. 22, 2012. 26 pages.

Ware, Frederick, U.S. Appl. No. 12/709,422, filed Feb. 19, 2010, re Preliminary Amendment dated Feb. 9, 2012. 8 pages.

* cited by examiner

LOW POWER MEMORY DEVICE

RELATED APPLICATIONS

This application is a continuation of U.S. patent application Ser. No. 13/466,082, filed May 7, 2012, entitled "Low Power Memory Device," which is a continuation of U.S. patent application Ser. No. 12/709,422 filed Feb. 19, 2010 and entitled "Low Power Memory Device," now U.S. Pat. No. 8,194,493, which is a continuation of U.S. patent application Ser. No. 12/018,489 filed Jan. 23, 2008 and entitled "Low Power Memory Device," now U.S. Pat. No. 7,916,970, which is a divisional of U.S. patent application Ser. No. 11/194,812 filed Aug. 1, 2005 and entitled "Low Power Memory Device," now U.S. Pat. No. 7,660,183; each of the aforementioned applications are hereby incorporated by reference in their entirety.

FIELD OF THE INVENTION

The disclosure herein relates to integrated circuits, data processing and to data storage within a data processing system.

BACKGROUND

In modern memory devices, storage banks are commonly partitioned into a set of small, fast subbanks that may be accessed in parallel to write and read blocks of data that span the width of the full storage bank. The trend in a number of memory applications, however, is toward finer-grained memory access so that, in a read or write operation directed to multiple subbanks, many storage locations may be accessed unnecessarily, needlessly consuming power and increasing thermal loading. As memory bandwidth demand continues to increase in portable and compact applications, future memory components will likely need to reduce power consumption to extend battery life and/or meet thermal loading specifications.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
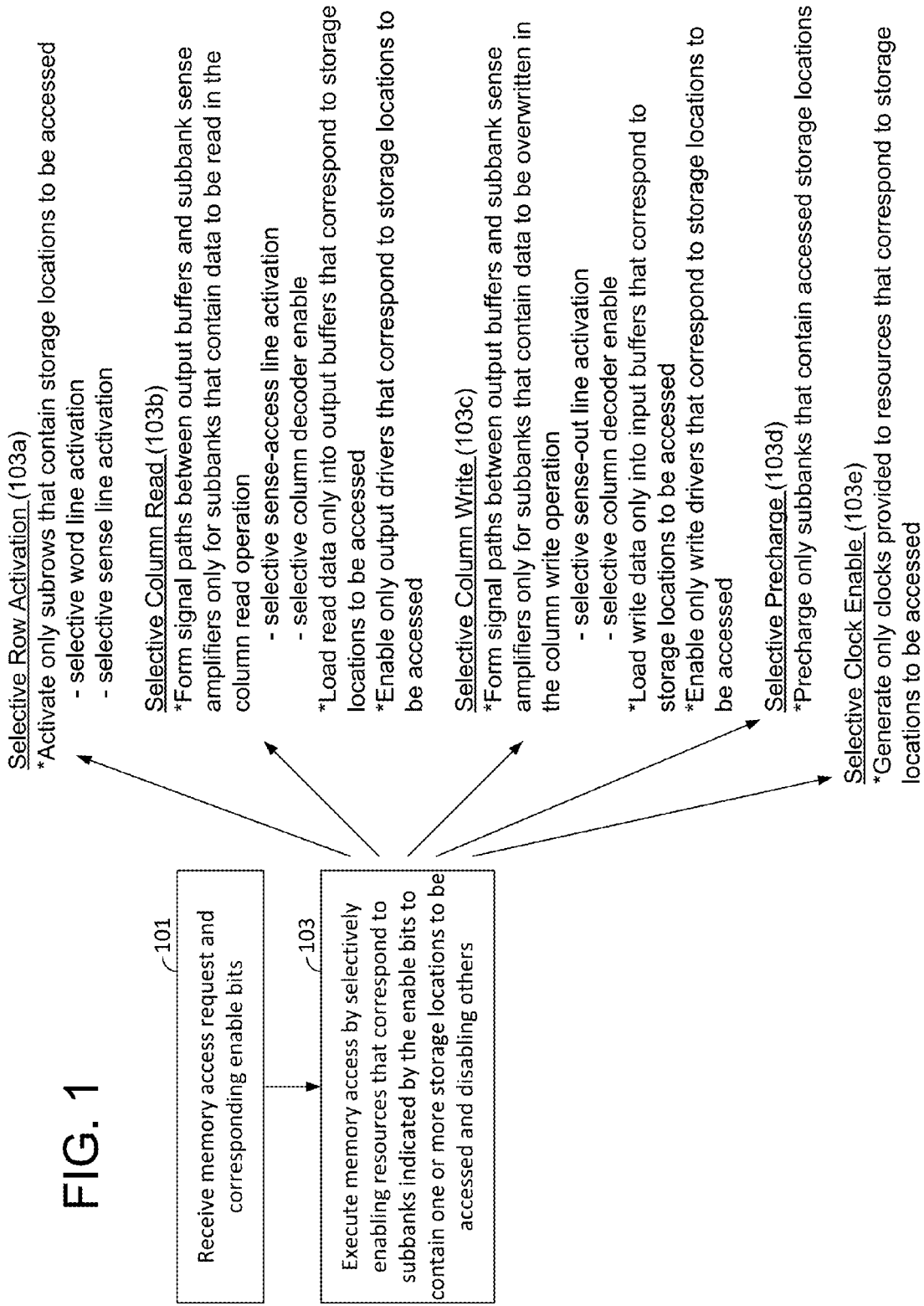
FIG. 1 is a flow diagram of a memory access in which resources are selectively enabled according to a set of enable bits.

Low power memory devices and systems are disclosed herein in various embodiments. In one embodiment, a memory command protocol includes a set of enable bits that are logically combined with an incoming memory access command to provide fine control of memory resources required to operate on data in an operation associated with the memory access command. In an embodiment illustrated in FIG. 1, for example, each memory access request received within a partitioned-bank memory device (101) includes or is accompanied by a set of enable bits that indicate, for each storage location within an address range spanned by or otherwise associated with the memory access request, whether the storage location is to be accessed. The memory access is executed at 103 by selectively enabling resources within the memory device according to the enable bits. That is, control circuitry within the memory device enables resources that correspond to subbanks indicated by the enable bits to contain one or more storage locations to be accessed and disables resources associated with the other, non-selected subbanks. For example, as shown at 103*a*, in a row activation within a dynamic random access memory (DRAM) device, only sub-rows (rows of storage cells within respective subbanks of the DRAM) that contain storage locations to be accessed are activated. As discussed in further detail below, row activation may be effected through word line activation to form a path between subbank bit lines and storage nodes within the storage cells of an address-selected subrow, and through sense line activation to enable a bank of sense amplifiers to sense the contents of the storage cells via the bit lines. Thus, word line activation and sense line activation (or either activation alone) may be disabled in non-selected subbanks (i.e., subbanks indicated by the enable bits not to contain storage locations to be accessed) to save power. Because the precharged state of bit lines and sense amplifiers within the non-selected subbanks is not disturbed, precharge operations may also be disabled in the non-selected subbanks to provide further power savings.

With regard to column access (read and write operations), column decoding may be disabled in non-selected subbanks and, in embodiments in which multiple column access operations are performed per row activation, may be selectively disabled in each column access operation according to whether the sense amplifier group that corresponds to a given subbank (i.e., sense amplifier subgroup) is to be accessed. More specifically, as shown at 103b, in a column read operation, column signal paths may be formed between output buffers and subbank sense amplifiers only for subbanks that contain data to be read in the column operation. In one embodiment, column signal path formation is effected through sense-access line activation to form a path between sense amplifier storage nodes and a set of global bit lines, and through multiplexed coupling of the global bit lines to a core-access path. Thus, sense-access line activation and global bit line multiplexing may be disabled in non-selected subbanks to save power. To save additional power, read data may be loaded only into output buffers that correspond to storage locations to be accessed and only those output drivers that correspond to storage locations to be accessed may be enabled to drive the read data onto an external signal path.

In a column write operation (103c), column signal paths may be selectively formed as in the column read operation and, to save additional power, write data may be loaded only into input buffers that correspond to storage locations to be accessed. Also, only those write drivers that correspond to storage locations to be accessed may be enabled to drive data onto the core-access path and thus onto the decoder-selected global bit lines. In other embodiments, each of the sampling circuits used to receive write data may be selectively enabled according to whether the enable bits indicate that the sampling circuit is to receive a valid write data value. Also, as discussed above, at the conclusion of a memory access, only those subbanks that contain accessed storage locations need to be precharged (as shown at 103d), potentially saving additional power. Finally, circuitry used to generate clock signals for specific storage regions may additionally enabled and disabled (103e) according to whether the storage regions are to be accessed.

Figure 2:
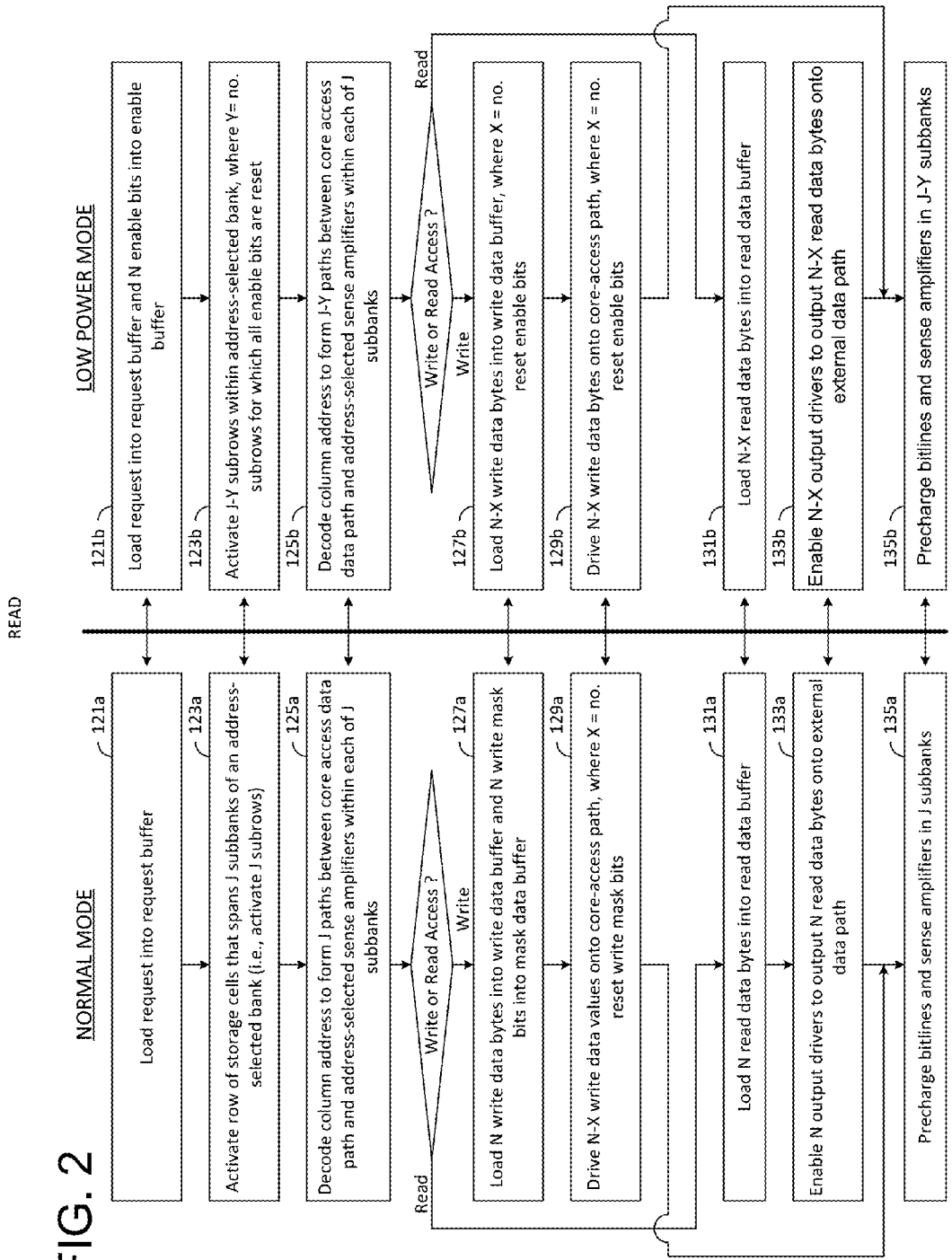
FIG. 2 illustrates a comparison between the normal and low power modes of operation in an embodiment of a low-power memory device.

In one embodiment, a memory device may be programmed during production or system run-time to operate in either a normal operating mode or a low power operating mode. FIG. 2 illustrates a comparison between the normal and low power modes of operation in such a memory device. Starting at 121a, in normal mode, the memory device loads an incoming memory access request into a request pipeline register. The memory access request indicates the nature of the memory access (e.g., read or write) and is accompanied by row and column address information that may be viewed as part of or separate from the request and may be received via a request interface, dedicated address interface or other interface (e.g., multiplexed onto a data interface). In the low power mode, a counterpart operation 121b is carried out to load the incoming memory access request into the request pipeline register and, additionally, to load a set of N enable bits into an enable pipeline register.

In normal mode, control circuitry within the memory device responds to the request by activating an address-selected row of storage cells that spans J subbanks of an address-selected bank (123a). That is, each of J subrows is activated. By contrast, at 123b in the low power mode, the control circuitry activates only J-Y subrows (i.e., J minus Y) within the address-selected bank, where Y is the number of subrows for which all the corresponding enable bits are reset. That is, the control circuitry activates only the subrows indicated by the enable bits to contain storage locations to be accessed. The number of non-activated subrows, Y, may change from memory access request to memory access request and generally ranges from 0 (activate all subrows) to J−1 (activate at least one subrow), though Y may additionally be allowed to equal or exceed J (activate zero subrows), for example, for test purposes. The activated subrows may be contiguous or noncontiguous.

At 125a of a normal mode memory access, a column address associated with the memory access request is decoded to form J column access paths between a core-access path (i.e., an internal data path of the memory device) and selected sense amplifiers within each subbank, thereby enabling write data to be written to the selected sense amplifiers in a write access and enabling read data to be read from the selected sense amplifiers in a read access. By contrast, at 125b of the low power mode, the column address associated is decoded to form J-Y paths between the core-access path and selected sense amplifiers within each of J-Y subbanks. Note that, in an embodiment where multiple column access operations are performed per row activation, fewer than J-Y paths may be formed between the core-access path and sense amplifiers for a given column access, depending on the number of subbanks that contain storage locations to be read or written in the column access.

In a normal mode write access, N write data bytes are loaded into a write pipeline register and N mask bits are loaded into a mask pipeline register at 127a. Thereafter, at 129a, N-X write data values are driven onto the core-access path, with X being the number of reset write mask bits. By contrast, in the low power mode, only N-X write data bytes are loaded into the write pipeline register at 127b, where X is the number of reset enable bits. As discussed below, the enable bits may also be used to prevent reception of the X unused write data bytes by selectively disabling sampling circuits of the data interface. At 129b, the N-X write data bytes are driven onto the core-access data path to complete the write operation.

In a normal mode read access, the N data bytes read from the sense amplifiers accessed in 125a are loaded into a read pipeline register (131a), and then N output drivers are enabled to output the N data bytes from the read pipeline register onto an external signaling path (133a). By contrast, in the low power mode, only the N-X read data bytes for which the corresponding enable bits are set are loaded into the read pipeline register (131b) and, accordingly, only N-X output drivers are enabled to output the N-X read data bytes onto the external signaling path (133b).

In the normal mode, the memory access is concluded at 135a by precharging bit lines and sense amplifiers in each of the J subbanks. By contrast, only the J-Y subbanks activated at 123b are precharged in the low power mode. Also, as discussed below, precharging may be omitted in selected subbanks where, for example, further memory read and write operations are to be carried out in the subbanks.

Reflecting on the comparison of the normal and low power operating modes, it can be seen that, through the selective subrow activation at 123b, selective write pipeline register loading at 123b, selective column path formation at 129b, selective read pipeline register loading at 131b, selectively enabling output drivers at 133b, and/or selective precharging at 135b, power may be saved in any memory access in which at least one subbank does not contain storage locations to be accessed in a given column access operation. Additional power may be saved in low power mode in other embodiments, for example, by selectively enabling sampling circuits to receive write data in accordance with the enable bits received at 121b. It should be noted that while memory access operations are shown in a particular sequence in FIG. 2, the order of operations may be changed and many or all of the operations may be performed in parallel (e.g., through pipelining of memory access requests). Also, while both write access and read access operations are shown, the column operations of a given memory access operation may be exclusively write operations or read operations). Moreover, any number, Q, of column access operations (i.e., read or write operations) may be performed per row activation in which case the N enable bits received at 121b may include multiple groups of N/Q enable bits that are applied respectively in the Q column access operations to control the loading of read/write pipeline registers, enabling of sampling circuits/output drivers and/or formation of paths between sense amplifier subgroups and the core-access path. Further, while the enable bits received at 121b are described in the embodiment of FIG. 2 and other embodiments herein as corresponding to respective bytes of data (or byte-wide storage locations), in all such embodiments, the enable bits may alternatively correspond to data values having more or fewer bits than a byte.

Figure 3:
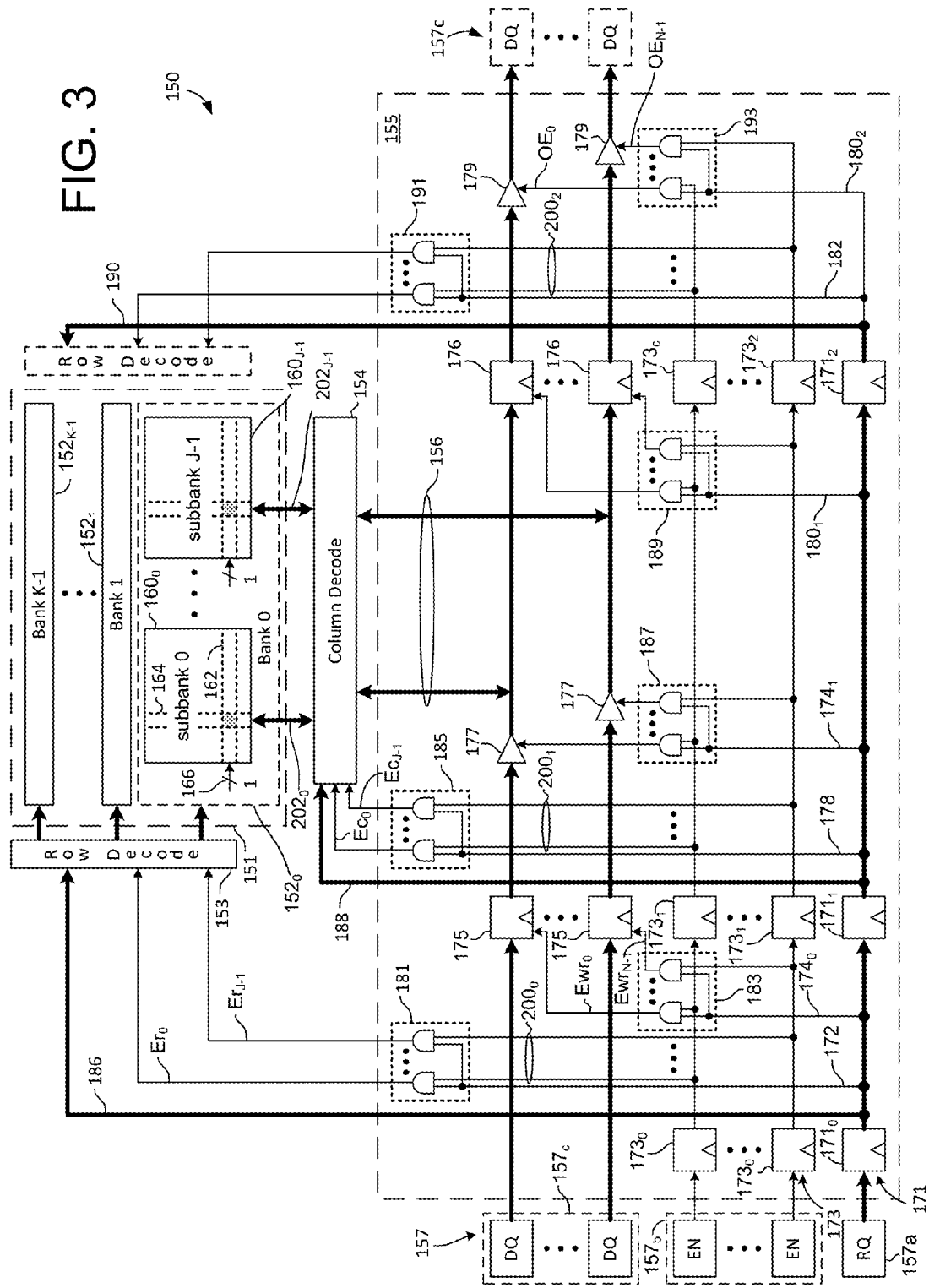
FIG. 3 illustrates an embodiment of a memory device having at least the low power mode of operation described in reference to FIG. 2.

FIG. 3 illustrates an embodiment of a memory device 150 having at least the low power mode of operation described in reference to FIG. 2. The memory device 150 includes a memory core 151, row decoder 153, column decoder 154, access control circuitry 155 and signaling interface 157. Multi-line interconnections between the components of the memory device 150 are generally shown in bold to distinguish them from non-bolded single-line interconnections, but the number of signal lines used to form each of the interconnections may vary in different embodiments.

The memory core 151 includes K storage banks $152_0$-$152_{K-1}$ each partitioned into J subbanks $160_0$-$160_{J-1}$. Storage cells are organized in rows and columns within each storage bank, and in subrows 162 and subcolumns 164 within each subbank 160. A row of storage cells within a given storage bank 152 includes a subrow 162 from each of subbanks $160_0$-$160_{J-1}$ and therefore spans J subrows, and a column of storage cells within a storage bank 152 likewise includes a subcolumn 164 from each of subbanks $160_0$-$160_{J-1}$ and therefore spans J subcolumns. The storage cells in each subrow 162 of each subbank 160 are coupled to the row decoder 153 by a respective word line 166, and the storage cells in each subcolumn 164 of each subbank 160 are coupled to the column decoder by a respective bit line or bit line pair (not specifically shown). Also, though not specifically shown in FIG. 3, the memory core 151 includes K sense amplifier banks coupled respectively to the K storage banks $152_0$-$152_{K-1}$, with each sense amplifier bank including a respective set of J sense amplifier subgroups (i.e., a group of sense amplifiers) that correspond to the J subbanks $160_0$-$160_{J-1}$ of the storage bank 152. In one embodiment, the bit lines include local bit lines disposed within each of the subbanks 160 and global bit lines $202_0$-$202_{J-1}$ that extend across multiple subbanks 160. The local bit lines may be coupled, for example, between subcolumns of a given subbank 160 and sense nodes of the corresponding sense amplifier subgroup, while the global bit lines $202_0$-$202_{J-1}$ may be coupled between output nodes of multiple sense amplifier subgroups (i.e., coupled to output nodes of sense amplifier subgroups for respective subbanks 160 within each of storage banks 152) and the column decoder 154. Other bit line arrangements may be used in alternative embodiments.

The signaling interface 157 includes a request interface 157a to receive incoming memory access requests, an enable interface 157b to receive enable bits associated with the memory access requests, and a data interface 157c to receive write data and output read data associated with the memory access requests. Each of the interfaces 157a, 157b, 157c includes one or more I/O (input/output) nodes which may be implemented by any structures capable of establishing physical contact (e.g., pins, pads, springs, balls, fiber-contact, etc.) or wireless connection (e.g., through RF transmission or inductive or capacitive coupling) to an external signal path or device. Each of the I/O nodes associated with the request and enable interfaces may be unidirectional and used to receive signals only, while the I/O nodes of the data interface may be bidirectional to enable data transmission and reception over bidirectional signaling links. Alternatively, dedicated I/O nodes may be provided to enable data transmission and reception over respective unidirectional signaling links. For example, a dedicated transmitter may be coupled to a first signaling link to provide data from the memory device to a memory controller, and a receiver may be coupled to a separate, second signaling link to receive data from the memory controller. Also, with regard to the enable interface, it should be noted that the same interface may be used in a normal mode to receive write-masking information. That is, in effect, resources that are used to receive normal-mode write masking information are re-used in the low-power mode to receive enable information, thereby enabling the low-power memory device 150 to be pin-compatible with a memory device not having a low power operating mode. Further, in another low power mode, the request, enable and/or data interfaces may be used to receive write masking information separately from low power enable information.

The access control circuitry 155 includes a multi-stage request pipeline register 171 formed by storage elements $171_0$-$171_2$ and a multi-stage enable pipeline register 173 formed by storage elements $173_0$-$173_2$. The request pipeline register 171 and enable pipeline register 173 are used to store incoming memory access requests and corresponding enable information and to enable pipelined execution of the specified memory access requests. Accordingly, the request pipeline register 171 and/or enable pipeline register 173 may include more or fewer constituent storage elements according to the number of pipeline stages needed to complete a memory access.

The access control circuitry 155 also includes a write pipeline register 175 and read pipeline register 176 that are employed in memory write and read operations, respectively. In the particular embodiment of FIG. 3, incoming memory requests and corresponding enable bits are loaded into the request pipeline register 171 and enable pipeline register 173, respectively, in response to the same clock edge (or clock edges) and prior to loading write data, if any, within the write pipeline register 175. By this arrangement, the enable bits may be applied to enable or disable resources within the access control circuitry 155, decoders (153, 154), and/or memory core 151 that are otherwise used to manage incoming write data or to carry out operations that occur prior to or concurrently with receipt of the write data.

In one embodiment, each incoming memory access request includes a bank address that specifies one of storage banks $152_0$-$152_{K-1}$, a row address that specifies a row of storage locations within the specified bank, and one or more column addresses that specify columns of storage locations to be accessed within the specified row. In alternative embodiments, the bank, row and column addresses or any subset thereof may be received on a separate address interface, or via a shared interface (e.g., the data interface may be multiplexed between address and data). Each memory access request is generally serviced in three phases that correspond to the three stages of the request pipeline register 171 and enable pipeline register 173: an activation phase that begins when a memory access request and corresponding enable information are clocked into buffer stages $171_0$, $173_0$, a column-access phase that begins when the memory access request and enable information are clocked into buffer stages $171_1$, $173_1$, and a precharge phase that begins when the memory access request and enable information are clocked into buffer stages $171_2$, $173_2$. Each of the activation phase, column-access phase, and precharge phase may be specified by a distinct command that is provided along with associated enable bits that provide finer grain control of control resources associated with a given command. Alternatively, two or more of the activation phase, column-access phase, and precharge phase may be included in a memory request in, for example, a packetized form. In one embodiment, commands may be specified by binary encoding a number control bits to form an operation code. In a specific example, combinations of 3 command bits may be used to indicate up to 8 specific commands.

In the activation phase, the bank address and row address are output to the row decoder via path 186, and an activation signal 172 is supplied to a power control circuit 181. The power control circuit 181, which is depicted symbolically by a set of logic AND gates, also receives enable signals $200_0$ and combines the activation signal 172 with groups of enable signals that correspond to each of subbanks $160_0$-$160_{J-1}$ to generate a set of J enable-row signals, $Er_0$-$Er_{J-1}$. The enable-row signals, $Er_0$-$Er_{J-1}$, are supplied to the row decoder 153 to either enable or disable row activation within corresponding subbanks $160_0$-$160_{J-1}$ of the banks-address-selected storage bank 152. By this operation, row activation may be performed in only those subbanks 160 indicated by the enable bits $200_0$ to contain at least one storage location to be accessed, thus avoiding unnecessary row activation (and concomitant power consumption) in the remaining subbanks. As a matter of terminology, the subbanks indicated by the enable bits to contain at least one storage location to be accessed in response to a given memory access request are referred to herein as selected subbanks in contradistinction to non-selected subbanks which are indicated by the enable bits $200_0$ to contain no storage locations to be accessed.

Continuing from the activation phase, if the memory access request specifies a memory write operation, a write signal $174_0$ is asserted to load write data into the write pipeline register 175. In one embodiment, the enable signals $200_0$ are combined with the write signal 174 in power control circuit 183 to generate a first set of enable-write signals, $Ewr_0$-$Ewr_{N-1}$, each having either an enable state or disable state (e.g., logic '1' or logic '0') according whether the respective enable bit indicates that the corresponding write data byte is to be written to the memory core 151. The enable-write signals are supplied to load inputs of respective byte-wide storage elements of the write pipeline register 175, thereby preventing power-consuming load operations in those buffer elements that are to receive null data (i.e., dummy data provided as a placeholder within the incoming data stream if provided at all). As discussed below, the enable-write signals may be used to control whether or not pipelining registers are clocked (i.e., selective loading through gated clocks) or by establishing a hold state in the pipelining registers. Though not specifically shown in FIG. 3, the write pipeline register 175 may include sampling circuits for recovering logic-level write data from signals received via the data interface. In one embodiment, the enable-write signals may also be supplied to sample-enable inputs of the sampling circuits to prevent power-consuming reception of null data (i.e., enable reception of valid write data only).

Note that the enable bits applied to control row activation and precharge operations may also be used to support selective refresh operations within the memory device, including auto-refresh operations initiated by a memory controller and self-refresh operations initiated by internal refresh control logic within the memory device. In either case, information indicative of specific subbanks 160 to be refreshed may be supplied in association with a refresh command (or loaded into a register of the memory device in a command placing the memory device in a self-refresh mode) and used thereafter to limit refresh operations (i.e., row activation followed by precharge) to specific subbanks 160. The subbanks selected to be refreshed may be, for example and without limitation, those that contain data or that contain a particular class of data.

In the column-access phase of a memory access, the bank address and column address provided in the memory access request are supplied via path 188 to the column decoder 154, and a column-access signal 178 is supplied to power control circuit 185 along with enable bits $200_1$. Power control circuit 185 combines the column-access signal with groups of enable bits that correspond to each of subbanks $160_0$-$160_{J-1}$ to generate a set of J enable-column signals ($Ec_0$-$Ec_{J-1}$). The enable-column signals are supplied to the column decoder 154 to either enable or disable path formation between core-access path 156 $202_0$-$202_{J-1}$ and address-specified columns of sense amplifiers (subcolumns) within corresponding sense amplifier subgroups (i.e., the sense amplifier subgroups for subbanks $160_0$-$160_{J-1}$). In one embodiment, for example, the column decoder 154 responds to an asserted enable-column signal by activating a sense-access line coupled to a sense amplifier subgroup for each subbank 160 of the address-selected bank, and by issuing column-select signals to a multiplexer circuit. The activated sense-access line couples the sense amplifiers of the bank-address-selected sense amplifier subgroup to the global bit lines, and the multiplexer forms a signal path between a column-address-selected subset of the global bit lines and the core-access path 156.

In a write operation, the enable bits $200_1$ are combined with the write signal $174_1$ (the '1' subscript indicating the column-access phase) in power control circuit 187 to generate a second set of enable-write signals ($Ewr'_0$-$Ewr'_{N-1}$) each having either an enable state or disable state according whether the respective enable bit indicates that the corresponding write data byte is to be written to the memory core 151. The enable-write signals are supplied to enable inputs of respective byte-wide write drivers 177 thereby enabling valid write data to be driven onto respective sets of global bit lines $202_0$-$202_{J-1}$ (and therefore to the storage nodes of the address-selected subcolumns of sense amplifiers) and disabling the write drivers that correspond to null data bytes. Note that instead of generating the second set of enable-write signals ($Ewr'_0$-$Ewr'_{N-1}$), the enable-write signals generated in the activation phase ($Ewr_0$-$Ewr_{N-1}$) may be buffered to maintain their availability during the column-access phase.

In a read operation, the enable bits $200_1$ are combined with a read signal $180_1$ in power control circuit 189 to generate a set of enable-read signals (Erd0-Erd$_{N-1}$) each having either an enable state or disable state according to whether a corresponding read data byte is to be read from the memory core 151. The enable-read signals are supplied to enable inputs of respective byte-wide storage elements within the read pipeline register 176 to selectively load read data present on the global bit lines $202_0$-$202_{J-1}$ (i.e., output onto the set of global bit lines by virtue of the column decoder operation described above) into the read pipeline register 176. In one embodiment, for example, each of the enable-read signals has either an enable state or a disable state according to a respective one of the enable bits and therefore enables only valid read data to be loaded into the read pipeline register 176 (i.e., prevents loading of null data).

Although a single column access operation has been described, multiple column access operations may be performed in the column-access phase of each memory access. In one embodiment, for example, each memory access request includes two column address values that are applied in separate halves the column-access phase in respective column access operations. In such an embodiment, the enable bits that correspond to the first column access operation within a given subbank (e.g., N/(2J) enable bits) are supplied to power control circuit 185 in the first half of the column-access phase (i.e., to control sub-column selection for purposes of reducing power consumption), and the enable bits that correspond to the second column access operation are supplied to power control circuit 185 in the second half of the column-access phase. In this manner, column decoding may be selectively performed in each column access operation. Note that, instead of an explicit precharge command, an auto-precharge may alternatively be used. For example, a precharge function may be encoded with a read or write command (e.g., the command indicating to read with auto-precharge or write with auto-precharge) such that precharging is performed automatically after the read/write access or, if auto-precharge is not specified in the read or write command, the sense amplifiers are left unchanged to enable further column accesses.

Still referring to FIG. 3, in the precharge phase of a memory access, the bank address provided in the memory access request is supplied to the row decoder 153 via path 190 and a precharge signal 182 is supplied to power control circuit 191 along with enable bits $200_2$. Power control circuit 191 combines the precharge signal with groups of enable bits that correspond to each of subbanks $160_0$-$160_{J-1}$ to generate a set of J enable-precharge signals (Ep$_0$-Ep$_{J-1}$). The enable-precharge signals Ep$_0$-Ep$_{J-1}$ are supplied, in turn, to the row decoder 153 to either enable or disable a precharge operation within corresponding subbanks $160_0$-$160_{J-1}$ of the address-selected storage bank 152. By this operation, precharge operations may be performed only in those subbanks 160 indicated by the enable bits to contain at least one storage location to be accessed, thus avoiding unnecessary power consumption in precharging non-selected subbanks 160.

The enable bits $200_2$ may also be combined with pre-charge-phase read signal, $180_2$, in power control circuit 193 to produce a set of output enable signals OE$_0$-OE$_{N-1}$. The output enable signals are supplied to respective byte-wide output drivers 179 to selectively enable read data to be output from the memory device. By this operation, only the output drivers 179 that receive valid read data are enabled to output data via the data interface 157c, avoiding or reducing power consumption in output drivers 179 that receive null data from the read pipeline register 176.

Reflecting on the memory device 150 it should be noted that the power control circuits 181, 183, 185, 187, 189, 191 and 193 function substantially independently of one another so that, in alternative embodiments, one or more of the power control circuits may be omitted or bypassed. Also, the logic used to generate the enable-write and enable-read signals in the different phases of the memory access may be combined in alternative embodiments so that such enable signals are generated by a single power control circuit and, if necessary, buffered to maintain their availability in later phases of the memory access. Further, as discussed below, additional circuitry may be provided to enable selection between a low power mode of operation (which employs one or more of the above-described power control circuits) and a normal operating mode. It should be noted that, while a unified set of enable signals has been described for controlling multiple memory access resources, separate sets of enable signals may alternatively be used to control individual resources or groups of resources in alternative embodiments.

Figure 4:
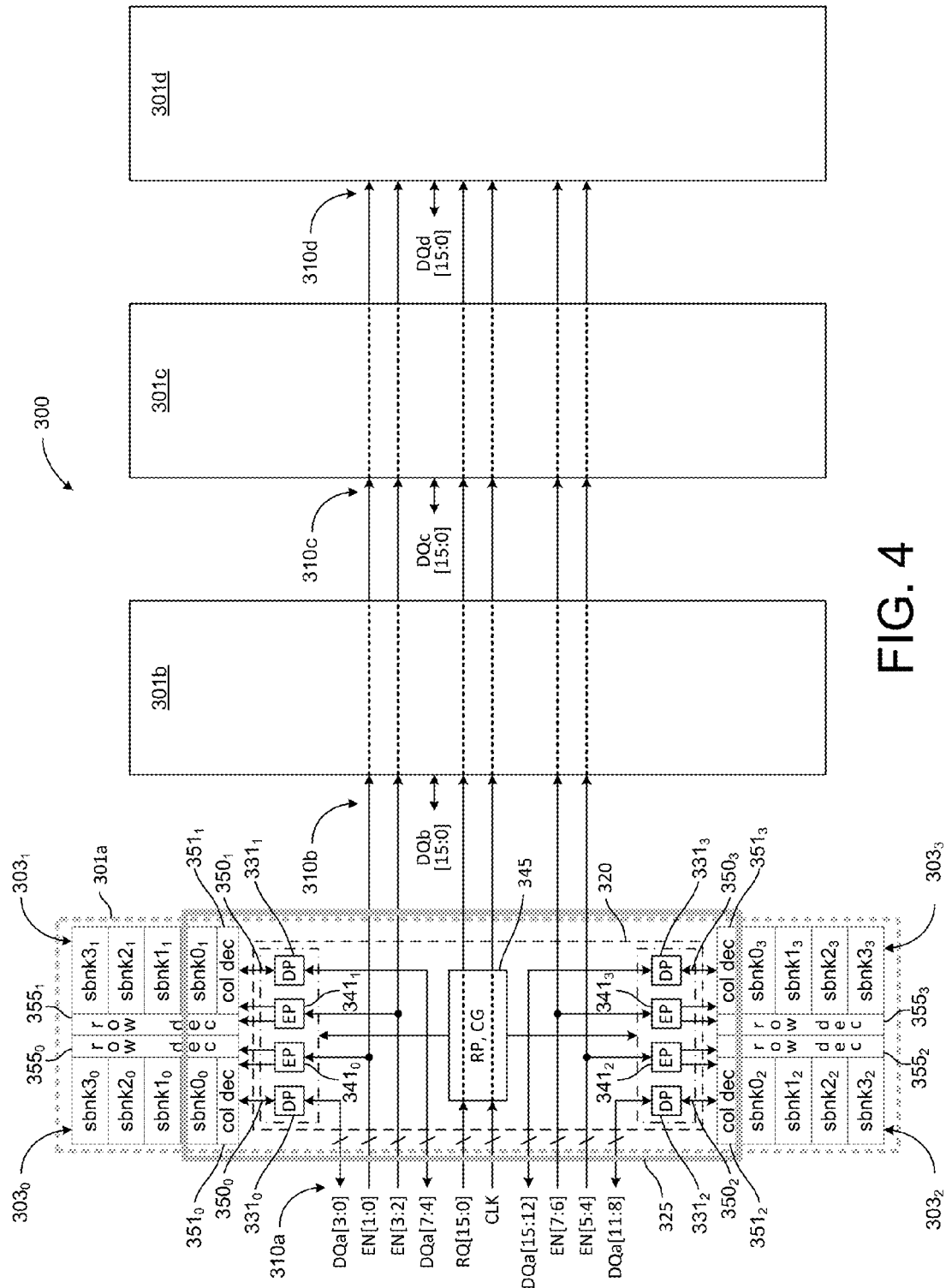
FIG. 4 illustrates a more detailed embodiment of a low power memory device.
Figure 5:
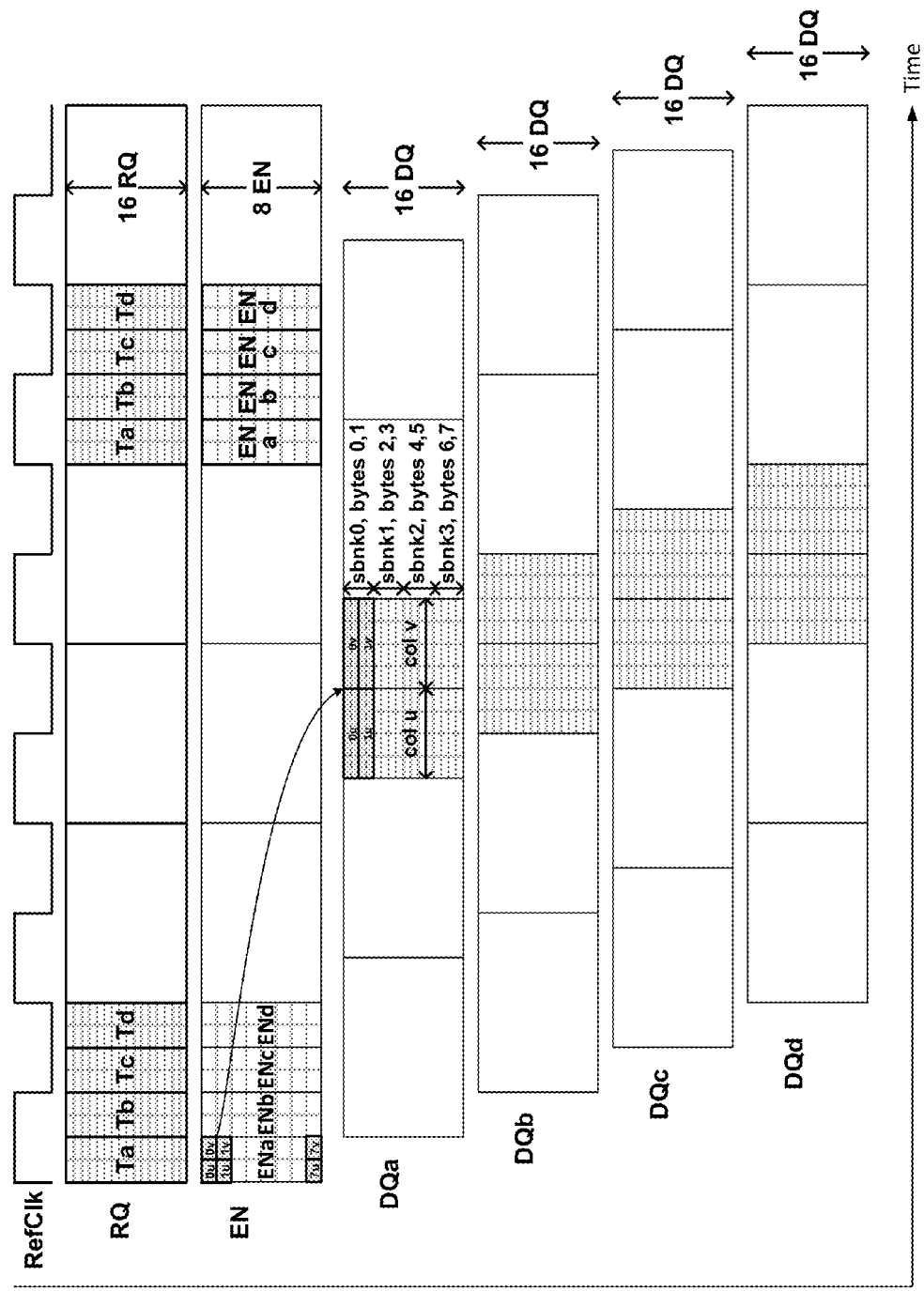
FIG. 5 illustrates a memory access timing diagram that corresponds to the low power memory device of FIG. 4.

FIG. 4 illustrates a more detailed embodiment of a low power memory device 300 and FIG. 5 illustrates a corresponding memory access timing diagram. The memory device 300 includes four storage entities 301a-301d, referred to herein as slices a-d, each slice including a set of four storage banks (banks 0-3), corresponding sets of column decoders $351_0$-$351_3$ and row decoders $355_0$-$355_3$, and access controller 320. Also, each of the four storage banks in a given slice 301 includes four constituent subbanks disposed in subbank groups $303_0$-$303_1$. That is, subbank group $303_0$ includes subbank0 of each of storage banks 0-3 (sbank$0_0$-sbank$3_0$), subbank group $303_1$ includes subbank1 of each of the storage banks (sbbank$0_1$-sbbank$3_1$), subbank group $303_2$ includes subbank2 of each of the storage banks (sbbank$0_2$-sbbank$3_2$) and subbank group $303_3$ includes subbank3 of each of the storage banks (sbbank$0_3$-sbbank$3_3$). The memory device 300 and other similarly-architected memory devices described below may have more or fewer storage slices 301, more or fewer storage banks per storage slice, and/or more or fewer subbanks per storage bank.

In the embodiment shown, the storage slices 301a-301d are coupled in common to a request interface (RQ[15:0]), clock line (CLK) and enable interface (EN[7:0]), which is illustrated in FIG. 4 in constituent enable line pairs EN[1:0], EN[3:2], EN[5:4] and EN[7:6]), but to respective 16-bit lanes of a data path, DQa[15:0], DQb[15:0], DQc[15:0] and DQd[15:0] (other request interface, enable interface and/or data interface widths or arrangements may be used in alternative embodiments). By this arrangement, memory access requests and corresponding enable information may be received within the access controller 320 of each slice 301 in respective time intervals, and the corresponding memory access operations and data transfer carried out concurrently (i.e., at least partly overlapping in time) within each of the four slices. Referring to FIG. 5, for example, memory access requests Ta, Tb, Tc and Td (e.g., received via a request interface as discussed above) may be received one after another in respective phases of a reference clock signal (CLK), and simultaneously with corresponding enable information, ENa, ENb, ENc and ENd. In one embodiment, the reference clock signal is supplied to a multi-phase clock generator (CG) within the access controller 320 for each storage slice 301 (or at least one of the slices 301) which, in turn, generates subphase clock signals for timing operations within the activation phase, column-access phase and precharge phase of each memory access request. For example, in the particular embodiment shown in FIGS. 4 and 5, each memory access operation is completed over a period of three clock cycles (i.e., cycles of clock signal, CLK)

after receipt of the corresponding request, the three clock cycles being split between the activation phase, column-access phase and precharge phase of the memory access. By this operation, memory access requests may be received and transacted in a pipelined manner.

In one embodiment, each memory access request includes or is accompanied by a row address, bank address, read/write bit and two column addresses. The row address and bank address are applied in the activation phase of each memory access, the bank address is applied in the precharge phase, and the two column addresses, colU and colV, are applied, in conjunction with the bank address, in respective halves of the column-access phase. Accordingly, separate sets of read data retrieved from storage locations indicated by the colU and colV addresses are output onto the data path in the precharge phase of a memory read transaction (i.e., read/write=0) and, separate sets of write data, destined for the storage locations indicated by the colU and colV addresses, are loaded into the memory device 300 during the precharge phase of a memory write transaction (read/write=1). In the exemplary configuration of FIG. 4 in which a respective 16-bit lane of the data path is allocated to data transfer for each of storage slices 301a-301d, and each cycle of the clock signal is subdivided into eight transmit (or receive) intervals, a total of 16 bytes of data is transferred to or from a given storage slice of memory device 300 per memory transaction (i.e., a memory transaction including, in this example, a row activation, two column accesses and a precharge operation, all or any subset of which may be specified in a memory access request received within the request pipeline register, as discussed above), with eight bytes being transferred for each column access. As discussed above, different data path widths, numbers of column access operations per row activation, and/or transmit intervals per clock cycle may be used in alternative embodiments, yielding different data transfer granularity per memory transaction and/or column access.

The enable information associated with each memory access request is referred to herein as an enable word and, in the embodiment of FIG. 4, includes sixteen bits; eight bits ($0u$-$7u$ as shown in FIG. 5) that correspond to the eight column-U data bytes (i.e., the data transferred to or from the storage locations indicated by the colU address) and that are received via enable lines EN[7:0] in a first reception interval, and eight bits ($0v$-$7v$) that correspond to the eight column-V data bytes and that are received via enable lines EN[7:0] in a second reception interval. Also, in the particular embodiment shown, each of the four subbanks ("sbnk") of a given storage bank are coupled via a data pipe (DP) to a respective set of four signal links within the 16-bit data lane allocated to the encompassing slice so that data from the four subbanks of an address-selected storage bank may be read or written in parallel over the 16-bit data lane. Thus, signal links DQa[3:0] are coupled to the data pipe (DP) for a first group of subbanks $303_0$ and are thus used to transfer the first pair of bytes (bytes 0 and 1) in an 8-byte column-U or column-V data set, and signal links DQa[7:4], DQa[11:8] and DQa[15:12] are similarly coupled to the data pipes for subbank groups $303_1$, $303_2$ and $303_3$ and are used to transfer the second data byte pair (bytes 2 and 3), third data byte pair (bytes 4 and 5) and fourth data byte pair (bytes 6 and 7), respectively, in each 8-byte column data set.

Referring to the detail view of storage slice 301a, access controller 320 includes data pipes $331_0$-$331_3$ and enable pipes $341_0$-$341_3$ that correspond to the subbank groups $303_0$-$303_3$, and a request pipe and multi-phase clock generator (shown collectively at 345) that output a shared set of control, address and timing signals to the data pipes 331 and enable pipes 341.

The data pipes $331_0$-$331_3$ are coupled to the column decoders $350_0$-$351_3$ via respective core-access paths $350_0$-$350_3$, and to respective 4-bit lanes of the 16-bit DQa data path. Similarly, the enable pipes $341_0$-$341_3$ are coupled to respective row decoder/column decoder pairs $351_0/355_0$-$351_3/355_3$ and to a respective 2-bit lane of the 8-bit enable path.

Figure 6:
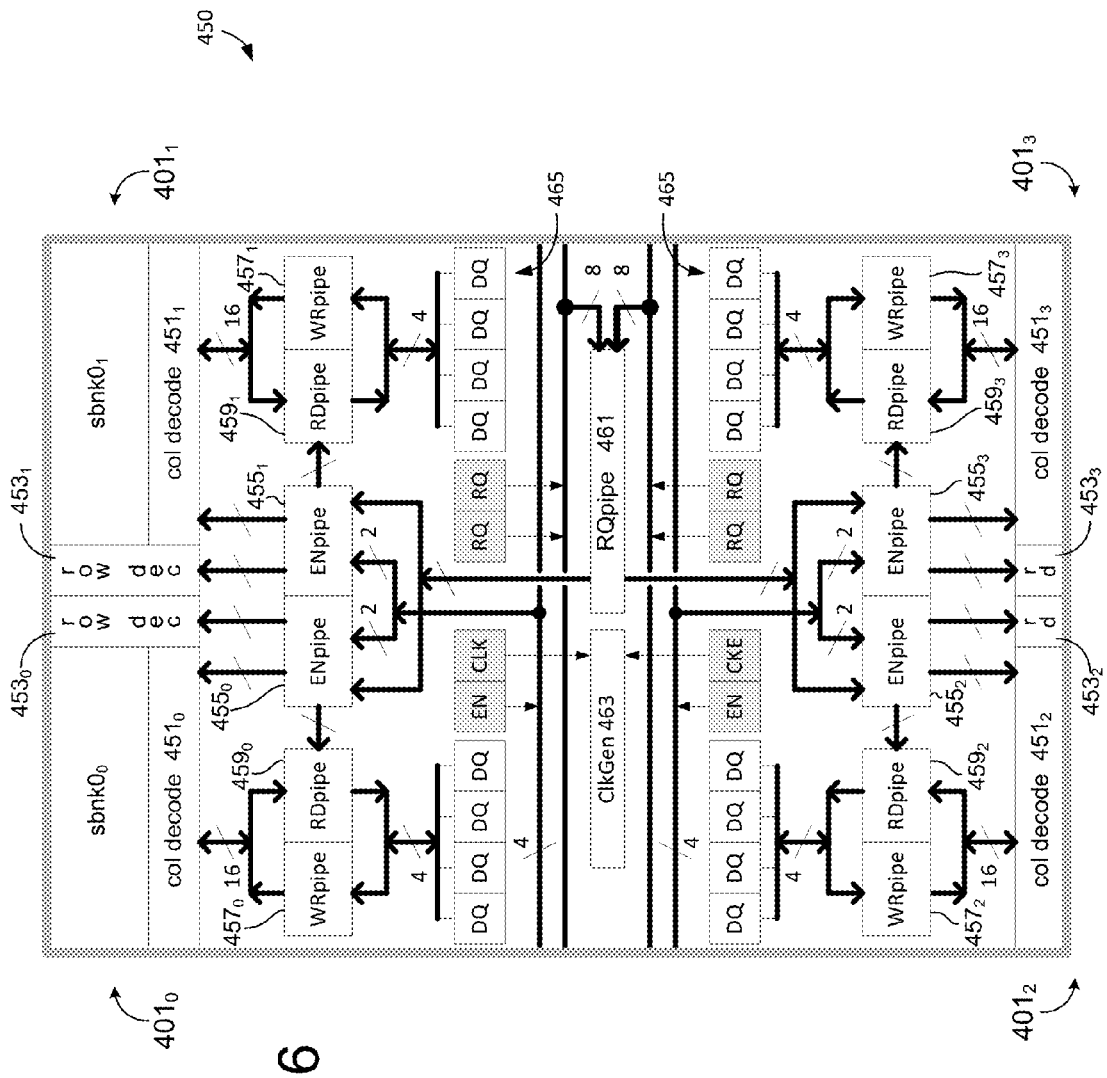
FIG. 6 illustrates a more detailed embodiment of a signal interface and access controller that may be used within the memory device of FIG. 4.

FIG. 6 illustrates a more detailed embodiment 450 of the signal interface 310a and access controller 320 of FIG. 4 (i.e., the region bounded by box 325 in FIG. 4) and their interconnection to column decoders $451_0$-$451_3$ and row decoders $453_0$-$453_3$ for the four subbank groups $401_0$-$401_3$ of a storage slice (only subbanks 0 and 1 of storage bank 0 being shown). In the particular implementation shown, each of the data pipes for the four subbank groups, $331_0$-$331_3$, includes a respective one of write pipes $457_0$-$457_3$ and a respective one of read pipes $459_0$-$459_3$, with each write pipe/read pipe pair coupled to a respective set of four data I/O nodes 465 (DQ). In one embodiment, each write pipe 457 and each read pipe 459 includes a storage buffer for sixteen data bits (the two bytes transferred in a given column access) which are transmitted or received four bits at a time over four transmit/receive intervals, for example, as shown in FIG. 5. In alternative embodiments, the write and read pipes 457, 459 may be coupled to more or fewer data I/O nodes and/or may transmit or receive column access data (read or write data) over more or fewer than four timing intervals. A request pipe 461 is coupled to a sixteen bit request interface formed by the four RQ input nodes shown and twelve other RQ input nodes, and each of four enable pipes $455_0$-$455_3$ is coupled to a respective two-bit lane of the an eight-bit enable interface formed by the two EN input nodes shown and six other EN input nodes. A clock generating circuit 463 (ClkGen) is coupled to receive a reference clock signal from one or more clock pins (CLK) that form the clock interface (e.g., one pin for clock and another for/clock), and generates a multi-phase clock signal (not shown in FIG. 6) that is supplied to the request pipe 461, enable pipes $455_0$-$455_3$ and data pipes $457_0/459_0$-$457_3/459_3$ to time operations therein. In one embodiment, the multi-phase clock signal includes eight phase-delayed instances of the reference clock signal referred to herein as subphase clock signals. The subphase clock signals are evenly distributed throughout a reference clock cycle and thus providing subphase timing control that may be used, for example, to establish receive intervals for capturing incoming memory access requests and associated enable bits and data, and transmit intervals for transmitting read data. The subphase clock signals may also be used to mark transitions between memory transaction phases (e.g., activation, column access and precharge phases) within each of the storage slices, thereby enabling memory transactions directed to each of the storage slices to be time-staggered as shown in FIG. 5. Alternatively, separate clock generating circuits 463 may be provided to generate a distinct set of multi-phase clock signals for each storage slice.

In the embodiment of FIG. 6, the clock generating circuit 463 includes gating logic to enable or disable clock generation according to the state of a clock enable signal received via clock enable pin CKE. In an embodiment that includes a clock generating circuit 463 per storage slice, the gating logic enables the multi-phase clock signals for each storage slice to be enabled or disabled (i.e., selectively enabled) according to whether the storage slice is to be accessed in a given memory transaction. In other embodiments, additional clock enable pins may be provided to permit finer-grained clock control of the clock tree within each storage slice, for example, enabling clock generation in those portions of the clock tree that provide clock signals to the resources for subbanks to be accessed in a given memory transaction, and disabling clock generation in portions of the clock tree that provide clock signals to the resources for non-selected subbanks.

Figure 7:
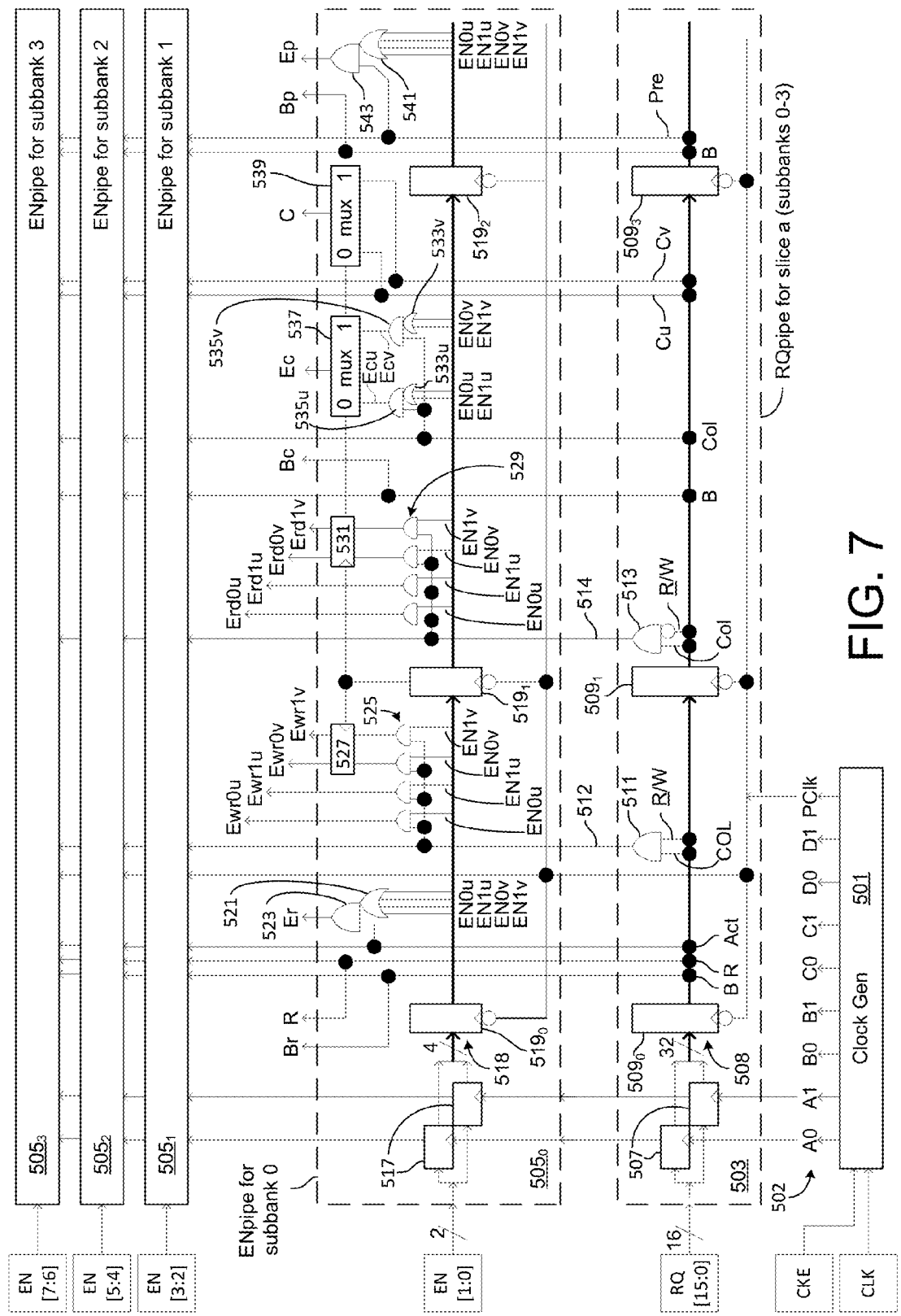
FIG. 7 illustrates embodiments of a clock circuit, a request pipe and enable pipes that may be used to implement the clock circuit, request pipe and enable pipes shown in FIG. 6.

FIG. 7 illustrates embodiments of a clock circuit 501, a request pipe 503 and enable pipes 505$_0$-505$_3$ that may be used to implement the clock circuit 463, request pipe 461 and enable pipes 455$_0$-455$_3$ of FIG. 6. The clock circuit 501 generates a set of subphase clock signals, A0, A1, B0, B1, C0, C1, D0, D1, that are progressively phase delayed from one another as described in reference to FIG. 6, and also outputs a pipeline clock signal PClk that is phase aligned with an incoming reference clock signal (received via clock pin, CLK) and used to clock memory access requests, enable information and data between stages of respective pipeline registers. The clock circuit 501 may also include gating logic to enable and disable clock generation according to the state of a clock enable signal (received via clock enable pin, CKE) and, like clock generating circuit 463 of FIG. 6, may include additional clock enable inputs to enable fine-grained control of the clock tree within the corresponding storage slice.

In one embodiment, the A0 and A1 subphase clock signals are supplied to respective sampling circuits 507 within the request pipe 503 and respective sampling circuits 517 within each of the enable pipes 505$_0$-505$_3$ to sample request and enable signals received via the request interface (RQ[15:0]) and enable interface (EN[7:0]), thus capturing a 32-bit memory access request and corresponding 16-bit enable word once per reference clock cycle. Each of the enable pipes 505$_0$-505$_3$ is coupled to a respective two-bit lane of the request interface so that the sampling circuits 517 within each enable pipe receives four enable bits per reference clock cycle.

The falling edge of the pipeline clock signal (PClk) is used to control the progression of a memory transaction through the activation, column access and precharge phases and is therefore supplied to storage elements 509$_0$-509$_3$ of a multi-stage request pipeline register 508 and to corresponding storage elements 519$_0$-519$_3$ of a multi-stage enable pipeline register 518. In one embodiment, the pipeline clock signal is phase aligned with the D1 subphase clock signal to provide a desired setup time at the output of sampling circuits 507 and 517, but may have a different phase in alternative embodiments. Also, subphase clock signals B0/B1, C0/C1 and D0/D1 may be provided to the request pipes and enable pipes for storage slices b, c and d, respectively, with correspondingly phase adjusted instances of a pipeline clock signal provided to control progression of memory transactions in those storage slices.

In the activation phase of the memory transaction (i.e., after the memory access request has been loaded into buffer 509$_0$ and corresponding enable bits have been loaded into buffer 519$_0$ within each of the enable pipes), a bank address (Br) and row address (R) provided in the request are supplied to the row decoders for each of the subbank groups, and an activate signal (Act) is asserted. The four enable bits received within the buffer 519$_0$ of each enable pipe correspond to four byte-wide storage locations within the corresponding subbank group, with a first pair of enable bits, EN0$u$, EN1$u$ corresponding to storage locations indicated by a first column address colU, and the second pair of enable bits, EN0$v$, EN1$v$, corresponding to storage locations indicated by a second column address, colV. Thus, if all four of the enable bits that correspond to a given subbank group, referred to herein as subbank enable bits, are deasserted (logic low in this example), then none of the storage locations falling within the address range specified by the bank, row and column addresses provided in the request (or otherwise associated with the request) are located within the subbank group. Accordingly, by logically ORing the subbank enable bits in OR gate 521 to produce a subbank-select signal (i.e., output of OR gate 521), then ANDing the subbank-select signal with the activate signal in logic AND gate 523, an enable row signal (Er) may be generated within each of the enable pipes 505$_0$-505$_3$ and output to corresponding row decoders to enable row activation only in enable-selected subbanks. That is, if the enable bits associated with a given memory access request indicate that none of the storage locations within the address range specified in the request are located within a given subbank group, then the subbank-select and enable-row signals will be deasserted to prevent row activation in the subbank group.

Figure 8A:
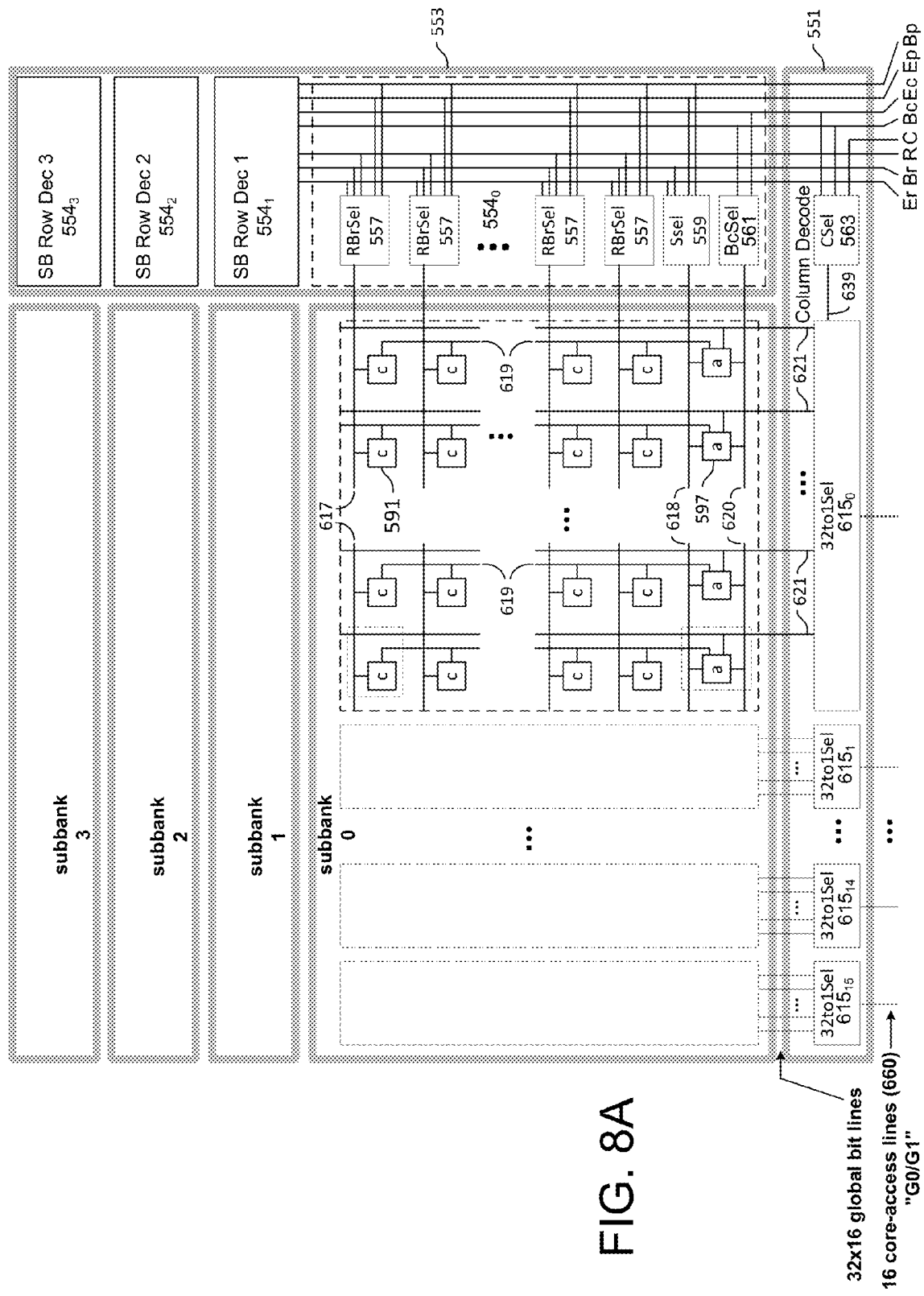
FIG. 8A illustrates an exemplary subbank group and associated row and column decoders that may be used in conjunction with the request pipe, enable pipes and clock circuit of FIG. 7.
Figure 8C:
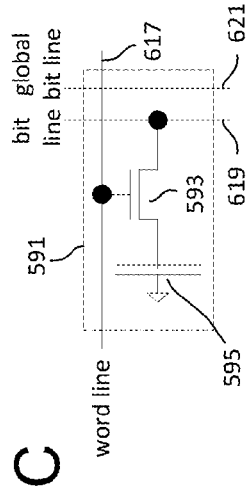
FIG. 8C illustrates an embodiment of a storage cell that may be used to implement each of the storage cells shown in FIG. 8A.
Figure 8E:
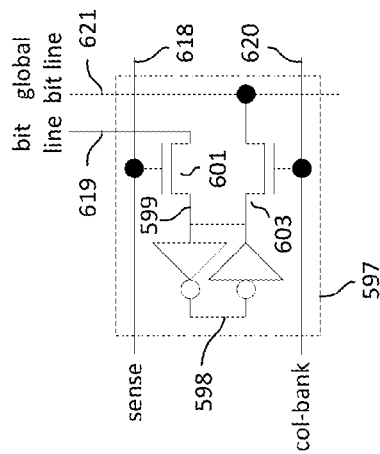
FIG. 8E illustrates an embodiment of a sense amplifier that may be used to implement the sense amplifiers shown in FIG. 8A.
Figure 8B:
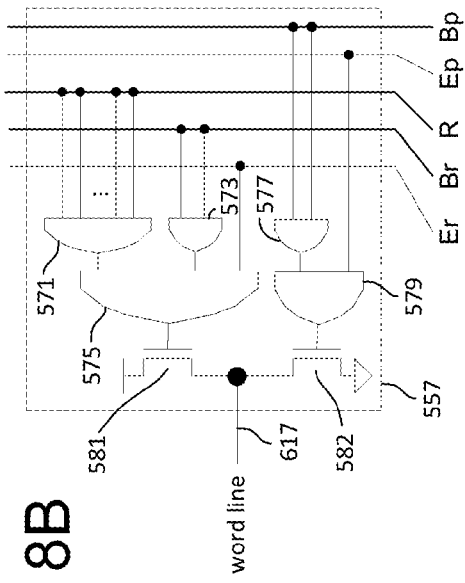
FIG. 8B illustrates an embodiment of a row-select logic circuit that may be used to implement the row-select logic circuit shown in FIG. 8A.

Referring to FIG. 8A, which illustrates an exemplary subbank group and associated row and column decoders, the enable-row signal (Er) is supplied to row-select logic circuits 557 associated with each word line 617 within each subbank of the subbank group along with the bank address (Br) and row address (R). More specifically, the row decoder 553 includes a plurality of subrow decoders 554$_0$-554$_3$, each including a set of row-select logic circuits 557 (one for each row of storage cells), a sense-select logic circuit 559 and a sense-access logic circuit 561. In one embodiment, shown in FIG. 8B, AND gates 571 and 573 within each row-select logic circuit 557 assert a row-select signal and bank-select signal if the row address and bank address match the bank and row, respectively, of the corresponding word line 617, so that bank-select and row-select signals will be asserted within the row-select logic circuit 557 for the address-specified word line 617. If the enable-row signal is also asserted, indicating that the corresponding subbank (and therefore the subbank group) contains at least one storage location to be accessed in the current memory transaction, the output of AND gate 575 goes high to switch on transistor 581 and thereby activate the address-specified word line 617. Activation of a given word line 617 establishes a path between an internal storage node of storage cells (C) coupled to the word line and a corresponding local bit line (or bit line pair) 619, thus enabling data to be transferred between the local bit lines and the storage cells. In one embodiment, each of the storage cells is a DRAM cell 591 formed by an access transistor 593 and capacitive storage element 595 coupled to each other and to the word line and local bit line, for example, as shown in FIG. 8C. When word line 617 is activated, access transistor 593 is switched on to form a path between the capacitive storage element 595 and local bit line 619. Other types of storage elements may be used in alternative embodiments including, for example without limitation, non-volatile storage elements (e.g., as used in Flash memory devices) or static random access memory ("SRAM").

Returning to FIGS. 8A and 8B, if the enable-row signal is low during the row activation phase of a memory access transaction, indicating that the corresponding subbank group contains no storage locations to be accessed, then the output of AND gate 575 goes low within each of the row-select circuits 557 so that no word line 617 is activated within the subbank group, thus conserving power. Also, because none of the word lines 617 of the subbank group are activated, none of the local bit line states are affected within the subbanks of the subbank group. Consequently, bit line precharging operations within the address-selected subbank and associated power expenditure may also be avoided.

Figure 8D:
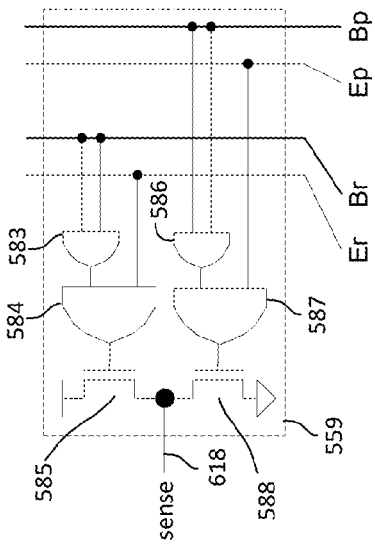
FIG. 8D illustrates an embodiment of a sense-select logic circuit that may be used to implement the sense-select logic circuit shown in FIG. 8A.

The enable-row signal is also supplied, along with the bank address, to the sense-select logic circuit 559 within each subbank row decoder 554. Each sense-select logic circuit 559 is coupled via a respective sense line 620 to the sense amplifier subgroup (formed by sense amplifiers 597 for the corresponding subbank. Referring to the sense-select logic circuit shown in FIG. 8D, AND gate 583 asserts a bank-select signal if the bank address selects the corresponding subbank so that the bank-select signal will be asserted within the sense-select logic circuit 559 of one of the subbank row decoders 554 in each row activation phase. If the enable-row signal is also asserted, indicating that the address-specified subbank (and therefore the subbank group) contains at least one storage location to be accessed in the current memory transaction, the sense line 620 for the address-specified subbank is activated (i.e., transistor 585 is switched on by operation of AND gate 584), thereby enabling the corresponding sense amplifier subgroup to sense the signals present on the local bit lines 619. By contrast, if the enable-row signal is low, the subbank group contains no storage locations to be accessed in the current memory access transaction and no sense line is activated within the subbank group, thus saving the power consumed in sense line activation and also avoiding the need to precharge the sense amplifier subgroup at the conclusion of the memory transaction. Referring to the exemplary sense amplifier 597 shown in FIG. 8E, the sense line 618 of a given subbank is coupled to a sense-enable transistor 601 within each sense amplifier 597 of the corresponding sense amplifier subgroup and, when activated, forms a path (via transistor 601) between the data nodes 599 of the sense amplifiers 597 and respective global bit lines 621, thereby enabling the data present on the local bit lines 619 to be received (i.e., sensed) within the sense amplifiers 597 of a selected sense amplifier subgroup in a row activation operation. Note that node 598 of the sense amplifier may be coupled to a dummy (adjacent) bit line and complement global bit line via respective transistors, not shown.

Figure 9:
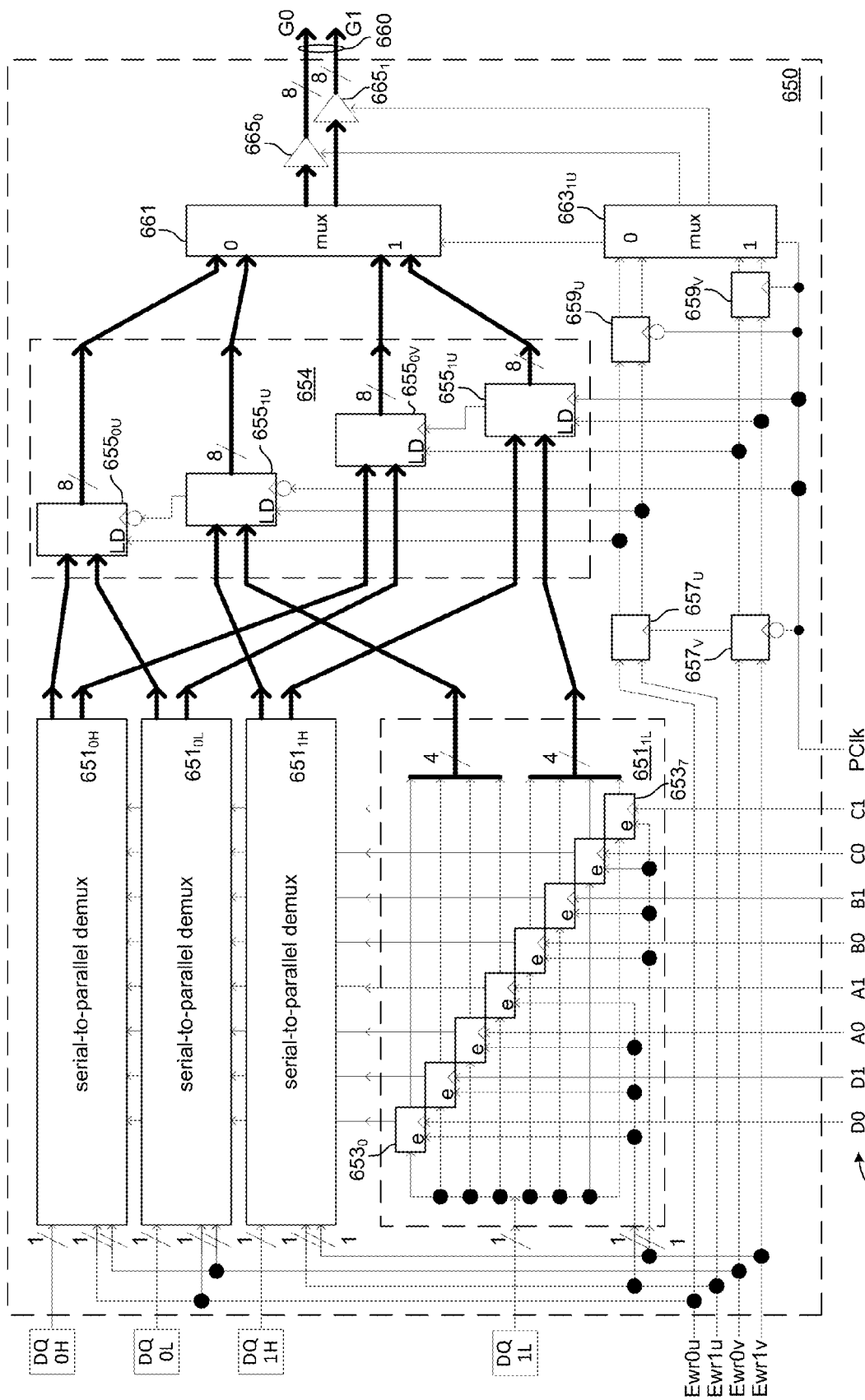
FIG. 9 illustrates an embodiment of a write data pipe that may be used in conjunction with the enable pipe shown in FIG. 7.

Referring again to FIG. 7, the subbank enable bits are also ANDed with a write signal 512 (itself generated by combination of the read/write specifier (R/W) and a column-access signal (Col) in AND gate 511) in AND gates 525 to generate a set of enable-write signals, Ewr0$u$, Ewr1$u$, Ewr0$v$ and Ewr1$v$, that may be used to selectively load each of the corresponding four write data bytes into the write pipeline register and to selectively enable the corresponding write drivers to output the write data onto the core-access path. FIG. 9 illustrates an embodiment of a write data pipe 650 that may be used in conjunction with the enable pipe 505 (FIG. 7) for a given subbank group. As shown, the data pipe 650 includes four serial-to-parallel demultiplexers $651_{0H}$, $651_{0L}$, $651_{1H}$ and $651_{1L}$ each coupled to a respective data I/O node ($DQ_{0H}$, $DQ_{0L}$, $DQ_{1H}$ and $DQ_{1L}$) to receive a sequence of eight write data bits in response to transitions of respective subphase clock signals 502. More specifically, write data bytes 0$u$ and 1$u$ to be applied in a first column access operation (i.e., a column operation directed to the colU address and referred to as the colU operation) are received by sampling circuits $653_0$-$653_3$ within respective pairs of demultiplexers $651_{0H}/651_{0L}$ and $651_{1H}/651_{1L}$ (each demultiplexer contributing either the high-order or low-order four-bits of a byte) in response to edges of subphase clock signals D0, D1, A0 and A1, and write data bytes 0$v$ and 1$v$ to be applied in a second column access operation (a colV operation) are received by sampling circuits $653_4$-$653_7$ of demultiplexer pairs $651_{0H}/651_{0L}$ and $651_{1H}/651_{1L}$ in response to transition of subphase clock signals B0, B1, C0 and C1. By this operation, two bytes of colU data are provided to be loaded into storage buffers $655_{0U}$ and $655_{1U}$, and two bytes of colV data are provided to be loaded into storage buffers $655_{0V}$ and $655_{1V}$.

Within demultiplexers 653, the enable-write signals that correspond to the colU data, Ewr0$u$ and Ewr1$u$, are supplied to enable inputs (e) of sampling circuits $653_0$-$653_3$ and the enable-write signals that correspond to the colV write data, Ewr0$v$ and Ewr1$v$, are supplied to the enable inputs of sampling circuits $653_4$-$653_7$, thereby providing for selective write data reception. More specifically, enable-write signal Ewr0$u$ is supplied to sampling circuits $653_0$-$653_3$ within the demultiplexers $651_{0H}$ and $651_{0L}$, to either enable or disable reception of byte 0$u$, and write-enable signal Ewr1$u$ is likewise supplied to sampling circuits $653_0$-$653_3$ within demultiplexers $651_{1H}$ and $651_{1L}$ to either enable or disable reception of byte 1$u$. Write-enable signals Ewr0$v$ and Ewr1$v$ are similarly supplied to sampling circuits $653_4$-$653_7$ within demultiplexer pairs $651_{0H}/651_{0L}$ and $651_{1H}/651_{1L}$ to either enable or disable reception of colV data bytes 0$v$ and 1$v$. Selective enabling of data reception may be effected within sampling circuits $653_0$-$653_3$ in a number of ways including, without limitation, decoupling the sampling circuits $653_0$-$653_3$ from one or more power supply lines (i.e., powering down the sampling circuits), gating one or more clock signals supplied to the sampling circuits $653_0$-$653_3$ and/or preventing operation of latching circuits or other circuit components of the sampling circuits $653_0$-$653_3$. Also, in embodiments having on-chip termination structures (e.g., pull-up circuit for charging signal lines to a nominal level) coupled to inputs of the sampling circuits $653_0$-$653_3$, such on-chip termination structures may be selectively activated according to the corresponding enable bits, for example, by switchably coupling each of the termination structures to one or more signal lines that form a signal link if the corresponding enable bit is in an enable state and switchably decoupling the termination structure from the one or more signal lines if the enable bit is in a disable state.

Enable-write signals Ewr0$u$ and Ewr1$u$ are buffered within storage element 657$u$ in response to a rising edge of the pipeline clock signal and supplied to the load-enable inputs of storage elements $655_{0U}$ and $655_{1U}$, respectively, within write pipeline register 654. Enable-write signals Ewr0$v$ and Ewr1$v$ are similarly buffered within storage element 657$v$ in response to a falling edge of the pipeline clock signal (i.e., a half cycle after Ewr0$u$ and Ewr1$u$ are buffered) and supplied to the load-enable inputs of storage elements $655_{0V}$ and $655_{1V}$, respectively, of the write pipeline register 654. By this operation, each write data byte is loaded into the write pipeline register 654 if the corresponding write enable bit is set, thus saving power by preventing null data from being loaded into the write pipeline register 654. In alternative embodiments, the enable-write signals may be used to gate the clock signals supplied to storage elements 655 instead of being supplied to load inputs. That is, all selectively loaded storage elements within the memory device may be implemented by loadable flip-flops or by gated-clock arrangements. Also, while edge-triggered storage elements are generally shown and described, latches or other level-based storage elements may alternatively be used to implement storage elements within request pipes, enable pipes and read/write data pipes.

In the particular embodiment of FIG. 9, storage elements $655_{0U}$ and $655_{1U}$ of the write pipeline register 654 are clocked by the falling edge of the pipeline clock signal and thus are loaded at the conclusion of the activation phase of the corresponding memory access transaction. Storage elements $655_{0V}$ and $655_{1V}$ are clocked by the rising edge of the pipeline clock signal and thus are not loaded until after the start of the column-access phase and after an activation phase for a subsequent memory transaction has begun. Accordingly, in one embodiment, the enable-write signals that correspond to the colV memory access, Ewr0$v$ and Ewr1$v$, are applied within the write data pipe 650 after the activation phase of a subsequent memory access transaction is initiated and, as shown in FIG. 7, are therefore strobed into buffer 527 of the enable pipe in response to a rising edge of the pipeline clock signal to maintain their availability in the next phase.

Still referring to FIG. 9, the colU data bytes buffered within storage elements $655_{0U}$ and $655_{1U}$ are output to the first input port of multiplexer 661, and the colV data bytes buffered within storage elements $655_{0V}$ and $655_{1V}$ are similarly output to the second input port of multiplexer 661. The select input of multiplexer 661 is coupled to receive the pipeline clock signal so that, when the pipeline clock signal is low (i.e., in the first half of the column-access phase), the colU data bytes 0u and 1u are passed to the inputs of write drivers $665_0$ and $655_1$, respectively, and when the pipeline clock signal is high (in the second half of the column-access phase), the colV data bytes 0v and 1v are supplied to the inputs of the write drivers $665_0$ and $655_1$. The enable-write signals Ewr0u and Ewr1u output from buffer element 657u are buffered within storage element 659u in response to a falling edge of the pipeline clock signal (i.e., a half cycle after being buffered in element 657u) and supplied to the first input port of multiplexer 663. Similarly, Enable-write signals Ewr0v and Ewr1v output from buffer element 657v are buffered within storage element 659v in response to a rising edge of the pipeline clock signal and supplied to the second input port of multiplexer 663. The select input of multiplexer 663 is coupled to receive the pipeline clock signal so that, during the first half of the column-access phase, when the two colU data bytes are output from multiplexer 661, enable-write signals Ewr0u and Ewr1u are provided to enable inputs of write drivers $665_0$ and $665_1$, respectively, so that each of the write drivers 665 is either enabled to drive or disabled from driving the corresponding colU data byte onto a respective byte lane (G0 or G1) of the core-access path 660. Similarly, during the second half of the column-access phase, when the two colV data bytes are output from multiplexer 661, enable-write signals Ewr0v and Ewr1v are output from multiplexer 663 to selectively enable write drivers 665 to drive the colV data bytes onto the core-access path 660.

Returning to FIG. 7, the column-access phase of a memory access begins when the memory access request has been loaded into storage element $509_1$ of request pipeline register 508 and the corresponding enable bits have been loaded into storage element $519_1$ of enable pipeline register 518. In the core-access phase, the column access signal (Col) is combined with the enable bits for the colU data to generate a first enable-column signal, Ecu, for the first column access, and with the enable bits for the colV data to generate a second enable-column signal, Ecv, for the second column access. More specifically, the enable bits for the colU data, EN0u and EN1u, are ORed in OR gate $533_U$ and then ANDed with the column-access signal in AND gate $535_U$ to generate the Ecu signal, and the enable bites for the colV data, EN0v and EN1v, are likewise ORed in OR gate $533_V$, then ANDed with the column access signal in AND gate $535_V$ to generate the Ecv signal. The Ecu and Ecv signals are supplied to first and second input ports of multiplexer 537 which, due to the pipeline clock signal applied at the multiplexer select input, outputs Ecu as enable-column signal (Ec) during a first half of the column-access phase (i.e., when the pipeline clock signal is low), and outputs Ecv as the enable-column signal during the second half of the column-access phase. Multiplexer 539 similarly outputs the column address for the colU access (i.e., Cu) as the column address (C) during the first half of the column-access phase, and outputs the column address for the colV access (i.e., Cv) as column address C during the second half of the column-access phase. The bank address (Bc) is also output during the column-access phase and applied within the row decoder as discussed below.

Figure 8G:
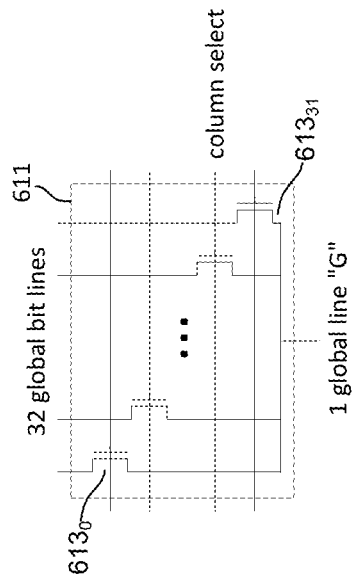
FIG. 8G illustrates an embodiment of a selector circuit that may be used to implement the selector circuits shown in FIG. 8A.
Figure 8H:
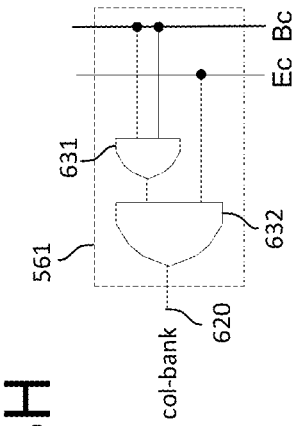
FIG. 8H illustrates an embodiment of a row-access logic circuit that may be used to implement the row-access logic circuit shown in FIG. 8A.
Figure 8F:
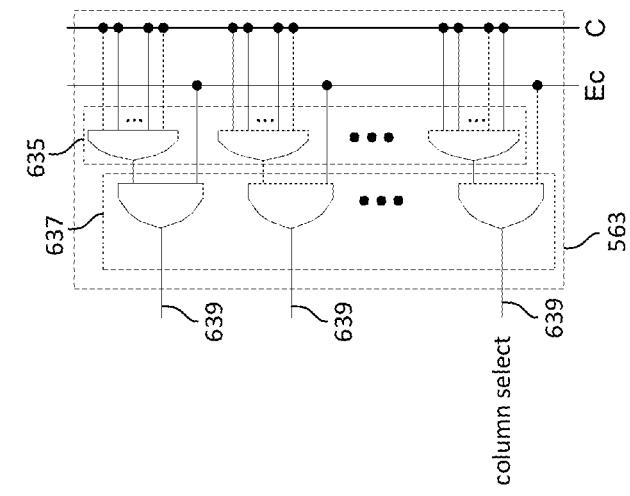
FIG. 8F illustrates an embodiment of a column-select logic circuit that may be used to implement the column-select logic circuit shown in FIG. 8A.

As shown in FIG. 8A, the column address (C) and enable-column signal (Ec) are supplied to a column-select logic circuit 563 within the column decoder 551. Referring to an exemplary embodiment of the column-select logic circuit shown in FIG. 8F, the column address is decoded by logic AND gates 635 to generate select signals which, are gated in turn with the enable-column signal in AND gates 637 to selectively activate one of thirty-two column select lines 639 (CS). The column select lines 639 are supplied to a multiplexer network to select a subset of sixteen global bit lines 621 from the total of 512 global bit lines 621 (i.e., 32×16) for the subbank group. More specifically, the thirty-two column select lines 639 are coupled to a set of sixteen 32:1 selector circuits $615_0$-$615_{15}$, each of which may be implemented as shown, for example by selector circuit 611 of FIG. 8G to include thirty-two pass-gate transistors $613_0$-$613_{31}$ coupled between a respective global bit line 621 and a signal line of the core-access path 660. The column select lines 639 are coupled to gate terminals of respective pass-gate transistors 613 so that, when a given column select line 639 is activated, a path is formed between a selected sixteen-bit subcolumn of sense amplifiers 597 within the sense amplifier subgroup and the sixteen-bit core-access path 660. If the enable-column signal is deasserted, indicating that no storage locations are to be accessed within the subbank group in the current portion of the column-access cycle (e.g., the colU access or the colV access), then none of the column select lines 639 are activated and no path is formed between the core-access path 660 and the sense amplifier subgroups of the subbank group, thus avoiding expenditure of power in the non-selected subbank group.

Still referring to FIG. 8A, the enable-column signal is also supplied, along with the bank address, to a sense-access logic circuit 561 within each of the subbank row decoders 554. In one embodiment, shown in FIG. 8H, each of the sense-access logic circuits 561 includes an AND gate 631 that raises a bank select signal in response to a bank address that specifies the corresponding subbank, and an AND gate 632 that activates a sense-access line 620 if the bank-select signal and enable-column signal are both asserted. Referring to the exemplary sense amplifier embodiment shown in FIG. 8E, the sense-access line 620 of a given subbank is coupled to an access transistor 603 within each sense amplifier 597 of the corresponding sense amplifier subgroup and, when activated, forms a path (via transistor 603) between the data nodes 599 of the sense amplifiers 597 and respective global bit lines 621, thereby enabling the contents of the sense amplifier subgroup to be output onto the global bit lines 621 in a read operation, and to allow write data present on the global bit lines 621 (i.e., on the global bit lines coupled to the core-access path 660 via the column decoder 551) to overwrite the contents of the selected subcolumn of sense amplifiers 597 in a data write operation. If the enable-column signal is deasserted, indicating that indicating that no storage locations are to be accessed within the subbank group in the current portion of the column-access cycle (e.g., the colU access or the colV access), then none of the sense-access lines 620 are activated within the subbank group and no path is formed between the sense amplifier subgroups and the global bit lines 621, thus further conserving power in non-selected subbank groups.

Referring again to FIG. 7, the subbank enable bits stored within storage element $519_1$ are also ANDed with a read signal 514 (itself generated by combination of the read/write specifier and the column-access signal in AND gate 513) in logic AND gates 529 to generate a set of enable-read signals (Erd0u, Erd1u, Erd0v and Erd1v) that may be used to selectively load each of the corresponding four read data bytes received from the memory core (i.e., via the core-access path) into the read data pipe. As with enable-write signals, Ewr0v and Ewr1v, the enable-read signals that correspond to the colV memory access, Erd0v and Erd1v, may be applied after the activation phase of a subsequent memory access transaction is initiated and, as shown, may therefore be strobed into buffer 531 to maintain their availability in the next phase.

Figure 10:
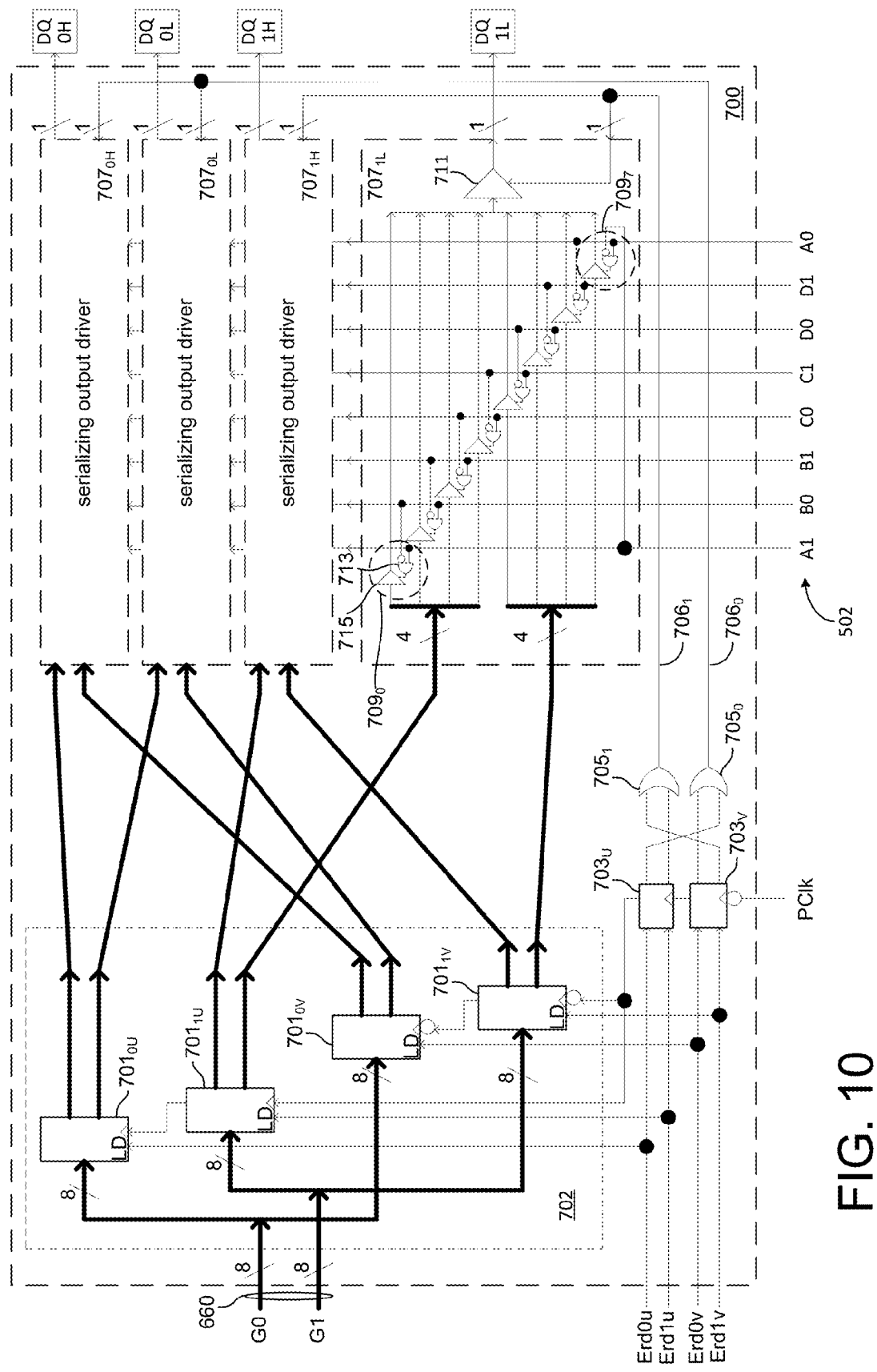
FIG. 10 illustrates an embodiment of a read data pipe that may be used in conjunction with the enable pipe shown in FIG. 7.

FIG. 10 illustrates an embodiment of a read data pipe 700 that may be used in conjunction with an enable pipe 505 of FIG. 7 for a given subbank group. As shown, the read data pipe 700 includes a read pipeline register 702 having four constituent storage elements $701_{0U}$, $701_{1U}$, $701_{0V}$ and $701_{1V}$. Storage elements $701_{0U}$ and $701_{1U}$ are coupled to the lower-eight lines (G0) and upper-eight lines (G1), respectively, of core-access path 660 and are clocked by the rising edge of the pipeline clock signal (PClk). Storage elements $701_{0V}$ and $701_{1V}$ are also coupled to the lower-eight and upper-eight lines of the core-access path 660, but are clocked by the falling edge of the recovered clock cycle. By this arrangement, the colU read data bytes are strobed into storage elements $701_{0U}$ and $701_{1U}$ at the conclusion of the first half of the column-access phase (i.e., when the pipeline clock signal goes high), and the colV read data bytes are strobed into storage elements $701_{0V}$ and $701_{1V}$ at the conclusion of the second half of the column-access phase, when the pipeline clock signal goes low. The upper and lower 4-bits of each buffered read data byte are driven onto respective data links of the data interface by a set of serializing output drivers $707_{0H}$, $707_{1H}$ and $707_{0L}$ and $707_{1L}$. As shown in the detail view $707_{1L}$, each of the serializing output drivers 707 includes a set of eight subphase data selectors $709_0$-$709_7$ that are enabled in respective subphase intervals, and an output driver 711 to drive the data selected by the data selectors onto a corresponding data link. In one embodiment, each of the subphase data selectors includes an AND gate 713 and driver element 715 that operate to pass a respective one of the eight input bits to the output driver in a corresponding one of eight transmit intervals. Referring to subphase data selector $709_0$, for example, AND gate 713 enables driver element 715 to output bit 0 of read data byte 1u when subphase clock signal A1 goes high, then disables driver element 715 when subsequent subphase clock signal B0 goes high. The AND gates 713 coupled to the remaining subphase driver elements are enabled to output the remaining three lower bits of data byte 1u, then the four lower bits of read data byte 1v in progressively delayed intervals, thus generating a serial stream of bits on data link $DQ_{1L}$ with bits 0-3 of data byte 1u being delivered first, followed by bits 0-3 of data byte 1v. The upper-four bits of data bytes 1u and 1v are similarly output onto data link $DQ_{1H}$ by serializing output driver $707_{1H}$, and the low and high order bits of data bytes 0u and 0v are output onto data links $DQ_{0L}$ and $DQ_{0H}$, respectively, by serializing output drivers $707_{0L}$ and $707_{0H}$. Enable-read signals, Erd0u and Erd1u are supplied to the load-enable inputs of storage elements $701_{0U}$ and $701_{1U}$, respectively, of the read pipeline register 702 and enable-read signals Erd0v and Erd1v are likewise supplied to load-enable inputs of storage elements $701_{0V}$ and $701_{1V}$ to prevent the read pipeline register 702 from being loaded with null data and thereby conserving power in any column read operation in which less than all storage locations within the address range specified by the bank/row/column address are to be accessed. In the embodiment shown, the enable read signals for colU data (Erd0u, Erd1u) are buffered within storage element 703u in response to a rising edge of the pipeline clock signal, and the enable read signals for colV data (Erd0v, Erd1v) are buffered within storage element 703v in response to a falling edge of the pipeline clock signal. The buffered enable-read signals that correspond to the low order byte in each of the colU and colV read operations (i.e., Erd0u and Erd0v) are logically ORed in OR gate $705_0$ to generate an output-enable signal $706_0$ that is supplied to output drivers 711 within the low-order byte serializing output drivers $707_{0L}$ and $707_{0H}$, thus disabling output-drive operation therein and preventing power from being expended to drive null read data onto the corresponding data links. The buffered enable-read signals that correspond to the high-order byte in each of the colU and colV read operations (i.e., Erd1u and Erd1v) are similarly ORed in OR gate $705_1$ to generate an output-enable signal $706_1$ for selectively enabling output drivers 711 within the high-order serializing output drivers $707_{1L}$ and $707_{1H}$. In alternative embodiments, the individual enable-read signals 706 for each of the colU and colV data bytes may be applied in order to the output drivers 711 within the corresponding output serializers to selectively enable the output drivers during each half of the clock cycle in which read data is output onto the serial links. For example, Erd0u may be applied to the output drivers 711 within output serializers $707_{0H}$ and $707_{0L}$ during a first half of the data output cycle (i.e., when colU data is being output) and Erd0v may be supplied to the same output drivers during the second half of the data output cycle, when colV data is being output. Erd1u and Erd1v may likewise be applied in succession to the output drivers 711 within serializing output drivers $707_{1H}$ and $707_{1L}$.

In alternative embodiments, the individual enable-read signals 706 for each of the colU and colV data bytes may be applied in order to the output drivers 711 within the corresponding output serializers to selectively enable the output drivers during each half of the clock cycle in which read data is output onto the serial links. For example, Erd0u may be applied to the output drivers 711 within output serializers $707_{0H}$ and $707_{0L}$ during a first half of the data output cycle (i.e., when colU data is being output) and Erd0v may be supplied to the same output drivers during the second half of the data output cycle, when colV data is being output. Erd1u and Erd1v may likewise be applied in succession to the output drivers 711 within serializing output drivers $707_{1H}$ and $707_{1L}$. Also, selective enabling of data transmission may be effected within output drivers 711 in a number of ways including, without limitation, decoupling the output drivers 711 from one or more power supply lines (i.e., powering down the output drivers), gating one or more clock signals supplied to the output drivers 711 and/or preventing operation of driver circuits or other circuit components of output drivers 711. Also, in embodiments having on-chip termination structures (e.g., pull-up circuit for charging signal lines to a nominal level) coupled to outputs of the output drivers 711, such on-chip termination structures may be selectively activated according to the corresponding enable bits, for example, by switchably coupling each of the termination structures to one or more signal lines that form a signal link if the corresponding enable bit is in an enable state and switchably decoupling the termination structure from the one or more signal lines if the enable bit is in a disable state.

Returning to FIG. 7, the precharge phase of a memory access begins when the memory access request is loaded into storage element $509_2$ of request pipeline register 508 and the corresponding enable bits are loaded into storage element $519_2$ of enable pipeline register 518. In the precharge phase, the precharge signal (Pre) is ANDed in gate 543 with a logic OR (performed in gate 541) of the subbank enable bits to generate an enable-precharge signal, Ep. By this operation, if all of the subbank enable bits are low, indicating that none of the storage locations specified in the current memory access request are located within the corresponding subbank group (and that no row activation was performed in the activation phase and, therefore, no precharge operation is necessary in the precharge phase), then the enable-precharge signal is deasserted to prevent an unnecessary precharge operation from being performed within the subbank group. Referring to FIGS. 7 and 8A, the enable precharge signal is supplied, along with bank address Bp (i.e., the bank address buffered within storage element $509_2$ of request pipeline register 508) to the row-select logic circuit 557 and sense-select logic circuit 559 within each subbank row decoder 554. If the enable-precharge signal is asserted, each of the word lines 617 within the subbank specified by the bank address is driven low by the corresponding row-select circuit 557 (i.e., through operation of gates 577 and 579, and transistor 582) to discharge any residual charge on the word line 617 activated in the activation phase. Similarly, the sense line 618 for the address-specified subbank is driven low by the corresponding sense-select circuit 559 (i.e., through operation of gates 586 and 587, and transistor 588) to discharge any residual charge on the sense line 618 activated in the activation phase. Thus, if no row activation was performed within the activation phase of the memory access, the enable-precharge signal will be low to prevent power expenditure in an unnecessary precharge operation. Note that the local bit lines 619 of the specified subbank and/or the global bit lines 621 of the subbank group may also be selectively precharged by a bit line precharge circuit (not shown) according to the state of the enable-precharge signal.

Reflecting on the memory device 300 of FIG. 4, and the corresponding timing diagram and embodiments of constituent components described in reference to FIGS. 5-10, it should be noted that various changes may be made without departing from the scope of the present invention. For example, while a DRAM architecture has been generally described, the power saving techniques and principles may be applied more generally in any memory device having multiple storage facilities that are accessed using parallel sets of resources. Also, particular interface widths, numbers of pipeline stages, slice, bank and subbank configurations, timing arrangements and allocation of interface nodes to the request interface, enable interface and data interface have been disclosed for purposes of clarity. In alternative embodiments, such particular details or any subset thereof may be changed to meet application needs.

Figures 11, 12, 13:
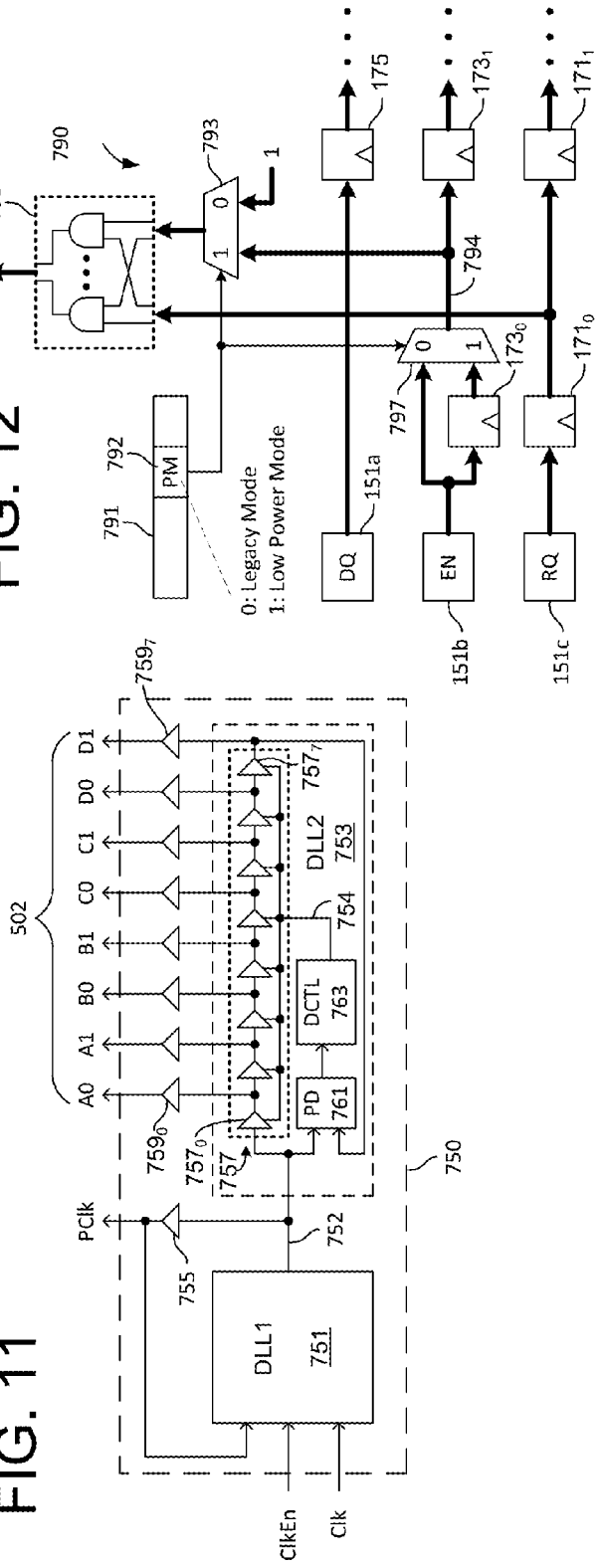
FIG. 11 illustrates an embodiment of a multiphase clock generator that may be used to implement the clock circuit shown in FIG. 7.
FIG. 12 illustrates a programmable configuration register and mode selection circuitry that may be used to transition a memory device between normal and low power operating modes.
FIG. 13 illustrates an embodiment of a memory system including a memory access requestor and a low power memory subsystem.

FIG. 11 illustrates an embodiment of a multiphase clock generator 750 that may be used to implement the clock circuit 501 of FIG. 7 and generate subphase clock signals 502. The multiphase clock generator 750 includes back-to-back coupled delay locked loops (DLLs) 751 and 753, with DLL 751 coupled to receive a reference clock signal (CLK) and generate the pipeline clock signal (PClk) in response. DLL 753 receives an unbuffered version of the pipeline clock signal 752 (i.e., pipeline clock signal prior to propagation through clock driver 755) and generates subphase clock signals 502. More specifically, DLL 753 includes a phase detector 761, delay control circuit 763 (e.g., a charge pump and charge storage element, not specifically shown) and a delay line 757 formed by daisy-chained (i.e., output-to-input coupled) delay elements $757_0$-$757_7$. The unbuffered pipeline clock signal 752 and output of the delay line 757 (i.e., output of the final delay element $757_7$) are provided to respective inputs of the phase detector 761 which, in turn, generates either a high or low phase control signal according to whether the delay line output lags or leads clock signal 752. The delay control circuit 763 responds to the phase control signal by raising or lowering a control signal 754 (e.g., a voltage or current control) applied to the delay elements $757_0$-$757_7$, thereby decreasing or increasing the propagation delay in the delay line 757 until, by virtue of the negative feedback loop formed through the delay line 757, phase detector 761 and delay control circuit 763, the delay line output is phase aligned with clock signal 752. By this operation, the outputs of the delay elements $757_0$-$757_7$ transition at respective sub-phase offsets that are evenly distributed within the cycle time of clock signal 752. Accordingly, the outputs of the delay elements $757_0$-$757_7$ are coupled to respective clock drivers $759_0$-$759_7$ to provide the subphase clock signals 502. In the particular embodiment shown, the delay line output (i.e., output of delay element $757_7$) is used to source subphase clock D1 so that, assuming a substantially matched delay in clock drivers 755 and $759_7$, subphase clock D1 is phase aligned with the pipeline clock signal. The assignment of the subphase clock signals to the clock drivers $759_0$-$759_7$ may be different in alternative embodiments so that the pipeline clock signal is phase aligned with a different subphase clock signal.

Still referring to FIG. 11, an optional clock enable signal (e.g., received via the CKE I/O node depicted in the access controller of FIG. 6) may be used to enable and disable subphase clock generation within multiphase clock generator 750. For example, in one embodiment, the clock enable signal is used to disable clock generation within DLL 751, causing the pipeline clock signal (PClk) and each of the subphase clock signals 502 to stop oscillating (i.e., to be disabled or shut off), and thereby placing the memory device in an extremely low power mode referred to herein as a standby mode. In standby mode, the memory device may be entirely disabled, or a low-speed internal clock signal may be used to perform a minimal set of maintenance operations, such as memory refresh. In an alternative embodiment, the clock enable signal may be provided directly to both DLL 751 and DLL 753 and thus directly disable DLL 753. Also, additional clock enable signals may be provided to multiphase clock generator 750 to control generation of individual subphase clock signals or groups of subphase clock signals according to the subbanks to be accessed in a given memory transaction. The additional clock enable signals may be used to disable subphase clock signal generation within clock generator 750 or may be applied elsewhere within the clock tree (not shown) to disable clock signal generation as desired for power-saving or other purposes.

FIG. 12 illustrates a programmable configuration register 791 and mode selection circuitry 790 that may be used to transition a memory device between the normal and low power operating modes described above. In the embodiment shown, the configuration register 791 includes storage for a power mode bit 792 (PM) that is used to select either the normal operating mode or the low power operating mode described in reference to FIG. 2. In alternative embodiments, multiple power mode bits may be provided, each to potentially control enable different portions of the low-power circuitry (e.g., respective bits to enable selective row activation, selective column decoding, selective precharge), for example, for test purposes or to meet particular needs of a given application. Also, the programmable register 791 may be run-time programmable, for example, in response to a configuration request issued to the memory device by a memory controller or other host device at system startup or upon detecting a threshold density of fine-grained memory accesses or other indication that low power operation is desirable (e.g., receiving an indication that the host device has been switched from line power to battery power). Alternatively, the programmable register 791 may be programmed at production time (e.g., through fuse-blowing or other one-time programmable operation) according to intended application of the memory device.

Still referring to FIG. 12, if a low-power mode of operation is selected, multiplexer 793 is set to pass enable bits 794 to power control circuitry 795 to selectively enable operations within a given subbank group. The power control circuitry 795 may include any or all of the power control circuits described in reference to FIG. 3 or other Figures herein for selectively enabling row activation, column decoding, data pipe loading, precharge, and so forth (with corresponding enable pipeline register stages provided to ensure the appropriate timing of the enable bits 794). If normal mode is selected, the multiplexer 793 is set to pass logic '1' values in place of the enable bits, thereby forcing the control logic circuitry 795 to enable activation, data pipe loading, column-access and precharge operations in each of the subbank groups. Multiplexer 797 is provided to bypass storage element $173_0$ of enable pipeline register 173 during normal mode operation, thereby enabling write mask bits to be received via the enable interface 151$b$ concurrently with data received via path 151$a$ and instead of enable bits.

FIG. 13 illustrates an embodiment of a memory system 810 including a processor 811 (or any other memory access requestor) and a low power memory subsystem 815. The memory subsystem 815 includes a memory controller 817 coupled to one or more memory modules 831$a$-831$n$, with each memory module 831 including one or more memory devices 835$a$-835$m$ (e.g., integrated circuit devices) and, optionally, a serial-presence detect 837 or other non-volatile storage that provides characterizing information for the corresponding memory devices 835. In one embodiment, the characterizing information may include power mode capability of the corresponding memory devices 835 (e.g., that the memory devices 835 are low power memory devices as described above and/or capable of being switched between normal and low power modes) in addition to storage capacity, maximum operating frequency and/or other memory device characteristics. By this arrangement, the memory controller 817 may read the characterizing information from the SPD 837 for each memory module 831 (or an SPD or like device for the set of memory modules) and identify one or more memory modules 831 as being low power memory modules or capable of being switched between normal and low power operating modes. In one embodiment, the memory controller 817 may program power modes within all selectable-power-mode memory devices 835 according to application needs or to establish uniform operation over all the memory modules 831. For example, if the set of memory modules 831 includes a hybrid assortment of power-mode-selectable memory modules and conventional memory modules, the memory controller 817 may program a normal-mode operation within the memory devices 835 of the power-mode-selectable memory modules to establish uniform operation across all the memory modules 831. Alternatively, the memory controller 817 (or processor) may allocate data storage within the memory modules according to power-mode selectability. For example, the processor 811 may instruct the memory controller 817 to allocate storage within the power-mode-selectable memory modules to application programs associated with mobile operation.

With respect to a power-mode selection within a given memory module 831, the memory controller 817 may dynamically transition the memory module 831 between normal and low power modes, for example, in response to detecting a transition between line power and battery power (e.g., such detection being signaled by the processor 811 or by a signal generated by line-power-detection circuitry, not shown), in response to detecting a threshold density of fine-grained memory accesses (e.g., memory access requests for which the host indicates that a threshold portion of data within the addressed storage range is unneeded) or in response to an explicit power mode command from the processor 811 or other control device.

Within the memory controller 817, a request generator 823 and enable generator 821 are provided to generate memory access requests (and operational requests to configure the memory devices, read the SPD, perform signaling calibration, refresh operations, etc.) and corresponding enable information in response to access requests from the processor 811 received via host interface path 812 (which may include separate data and request components as shown or a time-multiplexed path). A data pipe 819 is provided to buffer read and write data associated with the memory access requests and or configuration operations. A signaling path 818 that corresponds to the signaling interface of the memory devices described above in reference to FIGS. 3 and 4 (i.e., having data, enable (EN) and request (RQ) interfaces) is used to transmit memory access requests and associated enable information to the memory modules 831, and to transmit and receive write and read data associated with the memory access requests. Though not shown, one or more clock or strobe signal lines for conveying timing information (e.g., reference clock signal) may be provided to time the receipt of signals within the memory devices 835 and/or memory controller 817. Alternatively, clocking information may be embedded in the request and/or data transmissions (e.g., through coding to ensure sufficient transition density) and recovered within individual components of the memory subsystem. For example, in one embodiment, each of the memory devices 835 includes clock recovery circuitry to recover the reference clock signal described in reference to FIG. 11 from one or more signals transmitted via signaling path 818.

Although memory modules 831 are depicted in FIG. 13, the memory devices 835 (and, optionally, associated or integrated SPD elements 837) may be mounted directly to a mother board or integrated into a multi-chip module with the memory controller 817 and/or processor 811, for example, in a system-in-package (SIP) DRAM system. Also, the data path and enable/request path coupled between the memory devices 835 (or memory modules) and the memory controller 817 may be implemented using virtually any signaling channel, including an electronic conduction path, an optical path or wireless signaling channel. Further, the processor 811, memory controller 817, and/or one or more of memory devices 835 may be combined on a single integrated circuit die in an alternative embodiment.

It should also be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. The term "exemplary" is used to express an example, not a preference or requirement.

With respect to disabling the operation of logic circuits, storage elements, clock generating circuits and so forth, for purposes of reducing power consumption in unused signal paths and circuit blocks, it should be noted that circuits described as being disabled or deactivated by assertion or deassertion of a logic signal may alternatively be disabled or deactivated by decoupling such circuits from one or more power supply nodes, by gating clock signals supplied to such circuits or by taking any other action that results in lower power consumption. Conversely, circuits described as being disabled or deactivated by gating one or more clock signals may alternatively be disabled or deactivated by preventing logic operations from being carried out within such circuit, for example and without limitation, by preventing one or more control signals from being asserted or by ensuring that incoming data matches presently held data (e.g., effecting a hold operation within the circuit).

Various aspects of the subject-matter described herein are set out non-exhaustively in the following numbered clauses:

1. A method of operation within a memory device having a memory core and a signaling interface, the method comprising:
   receiving a command that specifies at least a portion of a memory access; and during the memory access:
   transferring data between the memory core and the signaling interface;
   transferring the data between the signaling interface and an external signal path; and
   receiving enable information prior to transferring the data between the signaling interface and the external signal path, the enable information to selectively enable at least a first memory resource and a second memory resource, wherein each of the first memory resource and the second memory resource performs a control function associated with the memory access.
2. The method of clause 1 wherein receiving enable information to selectively enable at least a first memory resource and a second memory resource comprises receiving enable information to selectively enable sampling circuits to receive write data from the external signal path.
3. The method of clause 2 wherein receiving enable information to selectively enable sampling circuits to receive write data from the external signal path comprises receiving enable information to selectively couple termination structures to respective signal links of the external signal path.
4. The method of clause 1 wherein receiving enable information to selectively enable at least a first memory resource and a second memory resource comprises receiving enable information to selectively enable data transfer between a first set of data storage elements and address-specified columns of sense amplifiers within a bank of sense amplifiers.
5. The method of clause 1 wherein receiving enable information to selectively enable at least a first memory resource and a second memory resource comprises receiving enable information to selectively load write data, received via the external signal path, into respective storage elements of a write pipeline register.
6. The method of clause 1 wherein receiving enable information to selectively enable at least a first memory resource and a second memory resource comprises receiving enable information to selectively transfer data from storage locations within the memory core to a bank of sense amplifiers according to the states of the enable signals.

7. The method of clause 1 wherein receiving enable information to selectively enable at least a first memory resource and a second memory resource comprises receiving enable information to selectively transfer data between a first set of storage elements within a data pipeline register and address-specified columns of sense amplifiers within a bank of sense amplifiers.

8. The method of clause 7 wherein selectively transferring data between a first set of data storage elements and address-specified columns of sense amplifiers comprises generating, in a first column access operation, column-access signals that correspond to respective subbanks within the memory core, each of the column-access signals having a state corresponding to whether the enable bits indicate that at least one storage location to be accessed in the first column access operation is disposed within the subbank to which the column-access signal corresponds.

9. The method of clause 8 wherein the bank of sense amplifiers comprises multiple sense amplifier groups that correspond respectively to the subbanks, and wherein selectively transferring data between a first set of storage elements and address-specified columns of sense amplifiers further comprises, for each of the subbanks, transferring data between the corresponding sense amplifier group and a respective subset of storage elements within the first set of storage elements if the column-access signal for the subbank is in an enable state.

10. The method of clause 9 wherein transferring data between the sense amplifier group and the subset of storage elements comprises activating an access-enable line coupled to the sense amplifier group if the column-access signal for the corresponding subbank is in the enable state.

11. The method of clause 9 wherein transferring data between the sense amplifier group and the subset of storage elements comprises forming a path in a multiplexing circuit coupled between the sense amplifier group and the subset of storage elements if the column-access signal for the corresponding subbank is in the enable state.

12. (The method of clause 1 wherein receiving enable information to selectively enable at least a first memory resource and a second memory resource comprises receiving enable information to selectively load the data into output storage elements for transmission onto the external signal path.

13. The method of clause 1 wherein receiving enable information to selectively enable at least a first memory resource and a second memory resource comprises receiving enable information to selectively enable output drivers to output the data onto the external signal path.

14. The method of clause 13 wherein receiving enable information to selectively enable output drivers to output the data onto the external signal path comprises receiving enable information to selectively couple termination structures to respective signal links of the external signal path.

15. The method of clause 1 further comprising selectively precharging storage subbanks of the memory core according to the enable information.

16. A method of operation within a memory device having a memory core, the method comprising:

receiving a memory access request and corresponding enable information, the enable information including enable values that correspond to respective storage locations within the memory core;

selectively transferring data from the storage locations to a bank of sense amplifiers according to the states of the enable values; and selectively enabling write drivers to output write data to the bank of sense amplifiers according to the states of the enable values.

17. The method of clause 16 wherein selectively enabling write drivers to output write data to the bank of sense amplifiers according to the states of the enable values comprises selectively enabling write drivers to output write data to address-specified columns of sense amplifiers within the bank of sense amplifiers.

18. The method of clause 16 wherein selectively transferring data from the storage locations to the bank of sense amplifiers comprises generating activate-enable signals that correspond to respective subbanks of the memory core, each of the activate-enable signals having either an enable state or a disable state according to whether the enable bits indicate that at least one of the storage locations to be accessed is disposed within the sub-bank to which the active-enable signal corresponds.

19. The method of clause 18 wherein selectively transferring data from the storage locations to the bank of sense amplifiers further comprises, for each of the subbanks, transferring data from storage cells within the subbank to sense amplifiers of the subbank if the activate-enable signal is in the enable state, and wherein the sense amplifiers of each of the subbanks collectively constitute the bank of sense amplifiers.

20. The method of clause 19 wherein transferring data from storage cells within the subbank to sense amplifiers of the subbank if the activate-enable signal is in the enable state comprises activating a word line coupled to a row of storage cells within the subbank if the activate-enable signal is in the enable state, the row of storage cells within the subbank constituting a subrow of storage cells within the storage bank.

21. The method of clause 19 wherein transferring data from storage cells within the subbank to sense amplifiers of the subbank if the activate-enable signal is in the enable state comprises activating a sense line coupled to the sense amplifiers of the subbank.

22. A method of operation within a memory device having a storage array and a bank of sense amplifiers coupled to the storage array, the method comprising:

receiving a memory access request and corresponding enable information, the enable information including enable values that correspond to respective groups of sense amplifiers within the bank of sense amplifiers;

selectively forming signal paths between the groups of sense amplifiers and respective write driver circuits according to the states of the enable values; and selectively enabling the write driver circuits to output write data to the groups of sense amplifiers via the signal paths according to the states of the enable values.

23. The method of clause 22 wherein selectively forming signal paths between the groups of sense amplifiers and respective write driver circuits according to the states of the enable values comprises selectively activating access-enable lines coupled respectively to the groups of sense amplifiers.

24. The method of clause 22 wherein selectively forming signal paths between the groups of sense amplifiers and respective write driver circuits according to the states of the enable values comprises selectively forming signal paths in multiplexing circuits coupled respectively between the sense amplifier groups and the write driver circuits.

25. A method of operation within a memory device having a memory core, the method comprising:
receiving a memory access request and corresponding enable information, the enable information including enable values that correspond to respective storage subbanks within the memory core;
selectively enabling write drivers to output write data to sense amplifier groups that correspond to the storage subbanks according to the states of the enable values; and
selectively precharging the storage subbanks according to the states of the enable values.

26. A method of operation within a memory device having a memory core, the method comprising:
receiving a memory access request and corresponding enable information, the enable information including enable values that correspond to respective storage subbanks within the memory core; and
selectively enabling input receivers to receive write data associated with the memory access request according to the states of the enable values.

27. A method of operation within a memory device having a memory core, the method comprising:
receiving a memory access request and corresponding enable information, the enable information including enable values that correspond to respective storage subbanks within the memory core; and
selectively loading write data associated with the memory access request into a write pipeline register according to the states of the enable values.

28. A method of operation within a memory device, the method comprising:
receiving a memory read request;
receiving enable bits that correspond to respective storage locations within the memory device; and
selectively transferring read data from the storage locations to an external signaling interface of the memory device according to states of the enable bits.

29. The method of clause 28 wherein selectively transferring read data from the storage locations to an external signaling interface comprises selectively transferring the read data from the storage locations to a sense amplifier bank according to the states of the enable signals.

30. The method of clause 28 wherein selectively transferring read data from the storage locations to the external signaling interface comprises selectively transferring the read data from a sense amplifier bank of the memory device to the external signaling interface according to the states of the enable signals.

31. The method of clause 30 wherein selectively transferring the read data from the sense amplifier bank to the external signaling interface comprises selectively loading the read data into output storage circuits according to the states of the enable signals.

32. The method of clause 30 wherein selectively transferring the read data from the sense amplifier bank to the external signaling interface comprises selectively enabling output drivers to output the read data to the external signaling interface according to the states of the enable signals.

33. A memory device comprising:
a storage bank having a plurality of storage subbanks;
a sense amplifier bank having a plurality of sense amplifier subgroups coupled respectively to the storage subbanks;
interface circuitry to receive a request to access a range of storage locations within the storage bank and enable bits that indicate, for each storage location within the range, whether the storage location is to be accessed;
control circuitry to selectively enable data to be transferred from the storage subbanks to the sense amplifier subgroups according to the enable bits; and
write driver circuitry to selectively output write data to the sense amplifier groups according to the enable bits.

34. The memory device of clause 33 wherein the range of storage locations comprises storage locations disposed within each of the storage subbanks and wherein the control circuitry comprises circuitry to enable data to be transferred, for each of the storage subbanks indicated by the enable bits to contain at least one of the storage locations to be accessed, from the storage subbank to the respective sense amplifier subgroup.

35. The memory device of clause 34 wherein the circuitry to enable data to be transferred from the storage subbank to the sense amplifier subgroup comprises circuitry to activate a word line coupled to a row of storage cells within the subbank if the enable bits indicate that the storage subbank contains at least one of the storage locations to be accessed.

36. The memory device of clause 34 wherein the circuitry to enable data to be transferred from the storage subbank to the sense amplifier subgroup comprises circuitry to activate a sense line coupled to the sense amplifier subgroup if the enable bits indicate that the storage subbank coupled to the sense amplifier subgroup contains at least one of the storage locations to be accessed.

37. A memory device comprising:
a sense amplifier bank having a plurality of sense amplifier subgroups;
interface circuitry to receive a request to access a range of storage locations within the memory device and to receive enable bits that indicate, for each storage location within the range, whether the storage location is to be accessed; and
a plurality of decoder circuits to form respective signal paths for accessing each of the sense amplifier subgroups indicated by the enable bits to contain data from at least one of the storage locations to be accessed.

38. The memory device of clause 37 further comprising an internal data path switchably coupled to the plurality of sense amplifier subgroups via the signal paths formed by the plurality of decoder circuits.

39. The memory device of clause 37 wherein each of the sense amplifier subgroups comprises a plurality of sense amplifiers, and wherein each of the decoder circuits comprises an output enable circuit to activate an output enable line coupled in common to the plurality of sense amplifiers within a corresponding one of the sense amplifier subgroups if the enable bits indicate that the one of the sense amplifier subgroups contains data from at least one of the storage locations to be accessed.

40. The memory device of clause 37 wherein each of the decoder circuits corresponds to a respective one of the sense amplifier subgroups and comprises a multiplexer to form a path between address-selected sense amplifiers within the corresponding sense amplifier subgroup and output nodes of the decoder circuit if the enable bits indicate that the sense amplifier subgroup contains data from at least one of the storage locations to be accessed.

41. The memory device of clause 37 further comprising write drivers coupled to the signal paths for accessing each of the sense amplifier subgroups.

42. The memory device of clause 41 further comprising control logic to selectively enable each of the write drivers to output write data to a respective address-selected column of sense amplifiers within the plurality of sense amplifier subgroups based, at least in part, on the state of a corresponding one of the enable bits.

43. The memory device of clause 41 further comprising a read pipeline register having storage circuits coupled respectively to the signal paths to receive read data from each of the sense amplifier subgroups.

44. The memory device of clause 43 further comprising control logic to selectively load each of the storage circuits of the read pipeline register with data from a respective address-selected column of sense amplifiers within the plurality of sense amplifier banks based, at least in part, on the state of a corresponding one of the enable bits.

45. A memory device comprising:
an interface to receive a request to access a range of storage locations within a storage array of the memory device and to receive enable bits that indicate, for each storage location within the range, whether the storage location is to be accessed; and
data storage circuits to store data associated with the request, each of the data storage circuits corresponding to a respective one of the enable bits; and
a control circuit to selectively enable each of the data storage circuits to be loaded with a data value associated with a respective storage location within the range according to the state of the corresponding enable bit.

46. The memory device of clause 45 further comprising a storage array and wherein the request to access a range of storage locations comprises a memory read request and the data associated with the request comprises data retrieved from the storage array and selectively loaded into the data storage circuits.

47. The memory device of clause 46 further comprising output driver circuitry to output data from the data storage circuits onto an external signal path, and wherein the control circuitry is configured to selectively enable the output driver circuitry to output data from each of the data storage circuits according to the state of the corresponding enable bit.

48. The memory device of clause 45 further comprising a storage array and a signaling interface, and wherein the request to access a range of storage locations comprises a memory write request and the data associated with the request comprises write data to be received via the signaling interface.

49. The memory device of clause 48 further comprising sampling circuitry coupled to the signaling interface to receive the write data, and wherein the control circuitry is configured to selectively enable the sampling circuitry to receive individual write data values of the write data according to the enable bits.

50. The memory device of clause 48 further comprising selectively loading each of the data storage circuits with a respective write data value of the write data if the corresponding enable bit is in an enable state.

51. A memory device comprising:
a storage array having storage subbanks;
sense amplifier groups coupled respectively to the storage banks;
interface circuitry to receive a request to access a range of storage locations within the storage array and enable bits that indicate, for each storage location within the range, whether the storage location is to be accessed;
write driver circuits to selectively transfer write data to the sense amplifier groups according to the enable bits; and
precharge circuitry to selectively to precharge the storage subbanks according to the enable bits.

52. Computer-readable media having information embodied therein that includes a description of an integrated circuit device, the information including descriptions of:
a storage bank having a plurality of storage subbanks;
a sense amplifier bank having a plurality of sense amplifier subgroups coupled respectively to the storage subbanks;
interface circuitry to receive a request to access a range of storage locations within the storage bank and enable bits that indicate, for each storage location within the range, whether the storage location is to be accessed; and
control circuitry to selectively enable data to be transferred from the storage subbanks to the sense amplifier subgroups according to the enable bits.

53. A memory device comprising
a memory core;
a signaling interface;
means for transferring data between the memory core and the signaling interface in response to a command that specifies at least a portion of a memory access;
means transferring the data between the signaling interface and an external signal path; and
means for receiving enable information prior to transferring the data between the signaling interface and the external signal path, the enable information to selectively enable at least a first memory resource and a second memory resource, wherein each of the first memory resource and the second memory resource performs a control function associated with the memory access.

While the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. A memory device, comprising:
at least one memory bank;
interface circuitry to receive memory read requests from an external source and to responsively supply read data from the at least one memory bank to the external source, and to receive memory write requests and associated write data from the external source,
wherein each memory read request is to specify a read request row corresponding to row address of memory cells in the at least one memory bank and a column address of memory cells within a row corresponding to the row address, and each memory write request is to specify a write row corresponding to a row address of memory cells in the at least one memory bank and a column address of memory cells within the write row, and wherein each memory read request and each memory write request is to be accompanied by bits that according to their states are to determine a variable amount of data to be exchanged with the external source; and logic responsive to the memory read requests and the memory write requests to, in dependence on state of the bits provided with each request, exchange the variable amount of data with the external source;

wherein the bits are first bits and wherein the memory write requests are selectively accompanied by write mask bits, such that the memory device is to selectively perform a masked write according to write mask bits accompanying a given memory write request, and such that the memory device is to selectively write a subset of a column of memory, independent from any write mask bits accompanying the given memory write request, in dependence on respective states of the first bits accompanying the given memory write request.

2. The memory device of claim 1, wherein the first bits are enable bits, and wherein the variable amount comprises an integer number of one or more subcolumns of data, each subcolumn to exchange data with to the external source according to the respective state of a corresponding one of the first bits.

3. The memory device of claim 1, wherein the interface circuitry is to couple to the external source via respective unidirectional links, and wherein each of the memory read requests and the memory write requests are to be received from the external source in packetized form in which the row address for a given memory request and the column address for the given memory request are provided together.

4. The memory device of claim 1, wherein:

each memory read request and each memory write request is to specify a bank address in addition to a row address and a column address;

the memory device comprises multiple memory arrays for each bank, each of the multiple arrays having a dedicated sense amplifier to exchange respective data with the external source; and the exchange of data with each of the multiple arrays for each bank is controlled responsive to respective state of a corresponding one of the first bits, such that the variable amount of data comprises the respective data exchanged with one or more of the multiple memory arrays for a given bank address.

5. The memory device of claim 4, wherein each one of the multiple arrays for each bank represents a slice and wherein the memory device further comprises enable signals respectively coupling the interface circuitry with the multiple arrays, each enable signal controlled responsive to the state of a corresponding one of the first bits associated with a request addressed to a corresponding bank, each one of the multiple arrays for the corresponding bank to exchange data with the external source in dependence on the respective enable signal.

6. The memory device of claim 1, wherein the variable amount comprises an integer number of bytes.

7. The memory device of claim 6, wherein the variable amount comprises a contiguous portion of the row.

8. The memory device of claim 1, wherein the memory device further comprises logic responsive to the states of the first bits provided with a memory read request to perform refresh of a variable number of memory cells associated with the row address and the column address.

* * * * *